United States Patent [19]
Kawahara et al.

[11] Patent Number: 6,034,428
[45] Date of Patent: *Mar. 7, 2000

[54] SEMICONDUCTOR INTEGRATED CIRCUIT DEVICE HAVING STACKED WIRING AND INSULATING LAYERS

[75] Inventors: Toshimi Kawahara; Hiroyuki Ishiguro; Mitsunada Osawa, all of Kawasaki; Shinichirou Taniguchi, Satsuma-gun; Mayumi Osumi, Kawasaki; Shinya Nakaseko, Kawasaki; Yoshitugu Katoh, Kawasaki; Junichi Kasai, Kawasaki, all of Japan

[73] Assignees: Fujitsu Limited, Kawasaki, Japan; Kyushu Fujitsu Electronics Limited, Kagoshima, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/745,203

[22] Filed: Nov. 8, 1996

Related U.S. Application Data

[63] Continuation of application No. 08/297,170, Aug. 29, 1994, abandoned.

[30] Foreign Application Priority Data

Nov. 22, 1993 [JP] Japan .................................... 5-292210

[51] Int. Cl.[7] ................................................ H01L 23/053
[52] U.S. Cl. ......................... 257/700; 257/738; 257/758
[58] Field of Search .................................. 257/666, 668, 257/673, 700, 737, 738, 758; 437/195; 361/748, 749, 760, 764, 774

[56] References Cited

U.S. PATENT DOCUMENTS

| | | | |
|---|---|---|---|
| 3,683,105 | 8/1972 | Shamash et al. | 29/589 |
| 4,435,740 | 3/1984 | Huckabee et al. | 361/398 |
| 4,783,695 | 11/1988 | Eichelberger et al. | 257/700 |
| 5,123,163 | 6/1992 | Ishikawa et al. | 257/738 |
| 5,521,332 | 5/1996 | Shikata et al. | 174/52.4 |
| 5,568,363 | 10/1996 | Kitahara | 361/773 |

FOREIGN PATENT DOCUMENTS

| | | | |
|---|---|---|---|
| 0252148 | 11/1991 | Japan | 257/668 |
| 0021537 | 1/1993 | Japan | 257/668 |

OTHER PUBLICATIONS

IBMTDB, Funari et al., Multilayer Circuitry Using Welded Metalized Polyimide Film, vol. 22, No. 9, Feb. 1980, p. 3988.

*Primary Examiner*—Sara Crane
*Attorney, Agent, or Firm*—Nikaido, Marmelstein, Murray & Oram LLP

[57] ABSTRACT

A semiconductor device includes a semiconductor chip, and a multi-layered member connected to the semiconductor chip. The multi-layered member includes one or a plurality of wiring layers and one or a plurality of insulating layers alternately stacked. The one or the plurality of insulating layers have holes. The multi-layered member has electrode parts which include deformed portions of the above one or the plurality of wiring layers obtained by deforming the above one or the plurality of wiring layers via said holes.

7 Claims, 16 Drawing Sheets

200~# SEMICONDUCTOR INTEGRATED CIRCUIT DEVICE HAVING STACKED WIRING AND INSULATING LAYERS

This application is a continuation of application Ser. No. 08/297,170, filed Aug. 29, 1994, now abandoned.

BACKGROUND OF THE INVENTION

1. Field of the Invention

The present invention generally relates to semiconductor integrated circuit devices, and more particularly to a semiconductor integrated circuit device having a semiconductor chip and a multi-layered wiring member to which the semiconductor chip is connected. Further, the present invention is concerned with a method of producing such a semiconductor integrated circuit device.

Recently, electronic devices such as personal computers are oriented to down-sizing and high-speed operation (higher than 100 MHz). Under the above circumstance, it is necessary to improve the density of mounting electronic parts such as LSI (Large Scale Integrated Circuit) chips on a mounting board. In addition, it is required to improve the electric characteristics (for example, high-spewed operation performance) of semiconductor integrated circuit devices themselves. It is also desired to reduce the production cost of semiconductor integrated circuit devices. In short, it is desired to provide miniaturized, less-expensive semiconductor integrated circuit devices having excellent electric performance.

2. Description of the Prior Art

In order to improve the electric performance of semiconductor integrated circuit devices, it is usually attempted to reduce the length of wirings including bonding parts and increase the thickness thereof as much as possible and to employ a multi-layer structure in which signal lines are formed on layers different from layers on which power supply and ground lines are formed.

A flip-chip method is known as a bonding method having excellent electric performance. In the flip-chip method, a semiconductor chip is connected to a mounting board by means of bumps. More particularly, soldering bumps of a semi-spherical shape are formed on electrode pads formed on a semiconductor chip, and the semiconductor chip is connected to electrode parts formed on a chip mounting board. The above method is disclosed in, for example, "LSI HANDBOOK", edited by the Institute of Electronics and Communication Engineers and published by Ohm-sha, pp. 409–411). Another bump forming process used for the flip-chip method is known in which the ends of TAB (Tape Automated Bonding) leads are formed into a semi-spherical shape by punching using a metal mold (Japanese Laid-Open Patent Application No. 3-252148).

The multi-layering requires electric connections between layers. This is achieved by, for example, forming a series of holes in layers to be connected and plating the inner walls of the holes. Such holes are called via hole or through holes (see "PRINTED CIRCUIT BOARD TECHNICAL MANUAL", edited by Zaidan-Hojin, Hihon Purint Kairo Kogyokai, pp. 8–10).

However, the above bump forming methods are very complex and need high precision. Hence, the methods lead to increase in the production cost. The method of forming the via or through holes needed in the multi-layering is very complex, particularly, in the step of plating the holes or filling the holes with an electrically conductive material. This leads to increase in the production cost and decrease in the yield. Further, the via holes have a limited arrangement pitch due to the mechanical strength of the board and formability, and thus cannot be arranged finely.

SUMMARY OF THE INVENTION

It is a general object of the present invention to provide a semiconductor integrated circuit device and a method of producing the same in which the above disadvantages are eliminated.

A more specific object of the present invention is to provide a miniaturized, less-expensive, high-electric performance semiconductor integrated circuit device and a method of producing the same.

The above objects of the present invention are achieved by a semiconductor device comprising:

a semiconductor chip; and a multi-layered member connected to the semiconductor chip, the multi-layered member comprising one or a plurality of wiring layers and one or a plurality of insulating layers alternately stacked the above one or the plurality of insulating layers having holes, the multi-layered member having electrode parts which include deformed portions of the above one or the plurality of wiring layers obtained by deforming the above one or the plurality of wiring layers via the holes.

For example, the electrode parts include projections of the above one or the plurality of wiring layers, the projections being oriented opposite to the semiconductor chip and being used for external connections.

For example, the electrode parts include projections of the above one or the plurality of wiring layers, the projections being oriented toward the semiconductor chip and being used for connections with the semiconductor chip.

For example, the electrode parts include projections of at least one wiring layer, the projections being in contact with at least another wiring layer, so that at least two wiring layers are electrically connected together.

It is possible to provide solder members provided on end portions of the deformed portions.

It is possible to provide reinforcement members provided on inner portions of the deformed portions.

It is possible to provide an electrically conductive member interposed between two wiring layers.

For example, the deformed portions include engagement recess portions which join at least two wiring layers together.

The above-mentioned objects of the present invention are also achieved by a method of producing a semiconductor device comprising the steps of:

(a) forming a multi-layered member comprising one or a plurality of wiring layers and one or a plurality of insulating layers alternately stacked, the above one or the plurality of insulating layers having holes;

(b) forming electrode parts in the multi-layered member by a predetermined tool, the electrode parts including deformed portions of the above one or the plurality of wiring layers obtained by deforming the above one or the plurality of wiring layers via the holes; and (c) providing a semiconductor chip on the multi-layered member.

For example, the step (a) comprises the steps of: alternately stacking the above one or the plurality of wiring layers and the above one or the plurality of insulating layers;

and patterning the above one or the plurality of wiring layers by using an etching liquid, in which a resist is provided on one of the wiring layers.

For example, the step (b) comprises the step of depressing, by means of a first tool member having one or a plurality of punches, the above one or the plurality of wiring layers via the holes formed in the insulating layers toward a second tool member, so that the deformed portions are defined.

For example, the step (b) comprises the step of simultaneously forming first projections of the above one or the plurality of wiring layers, the projections being oriented opposite to the semiconductor chip and being used for external connections and second projections of the above one or the plurality of wiring layers, the second projections being oriented toward the semiconductor chip and being used for connections with the semiconductor chip, the first and second projections corresponding to the electrode parts.

For example, the above method further comprises the step of sealing the semiconductor chip mounted on the multi-layered member by means of resin.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
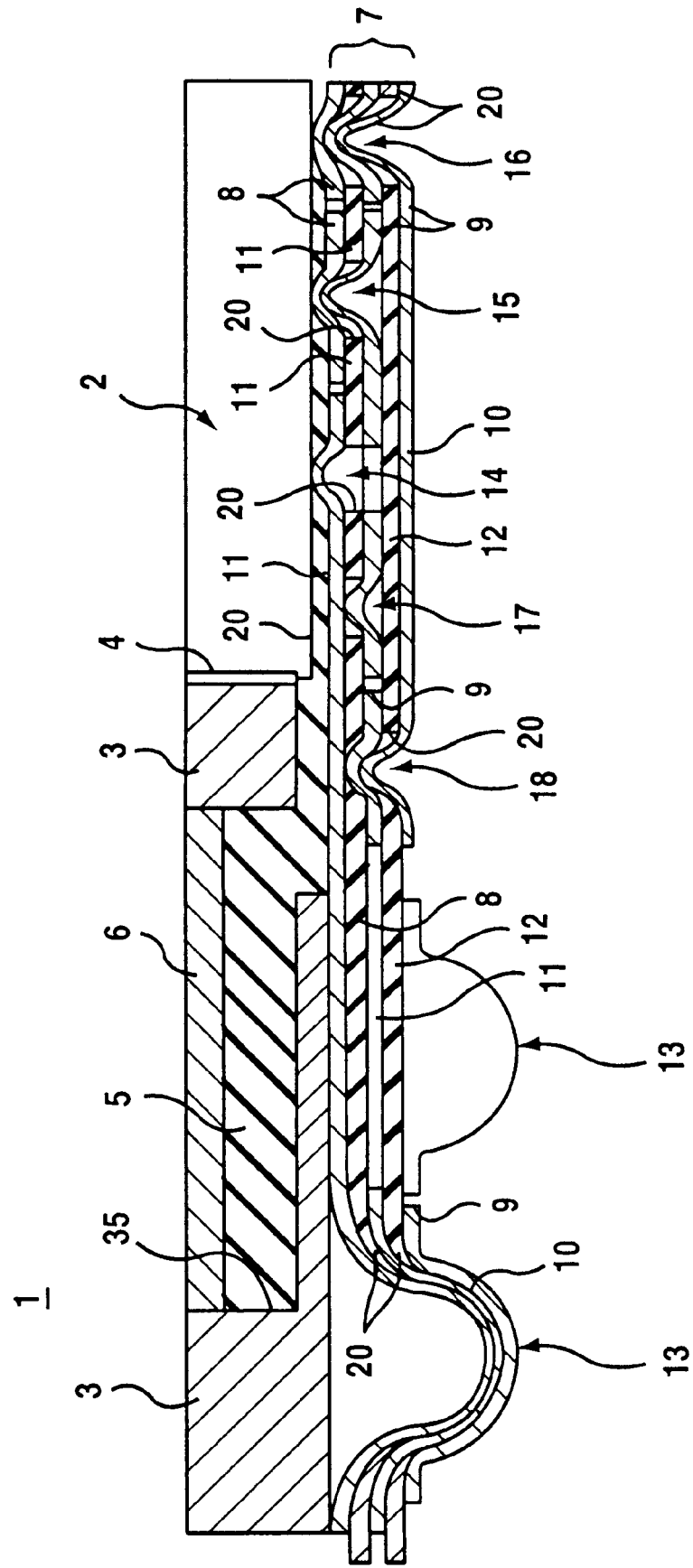
FIG. 1 is a cross-sectional view of a semiconductor device according to an embodiment of the present invention.

FIG. 1 is a cross-sectional view of a semiconductor integrated circuit device 1 according to an embodiment of the present invention. The semiconductor integrated circuit device 1 has a runnerless mold package structure using a multi-layered TAB.

A semiconductor chip 2 having a side, which adheres to a base 3 structuring a package. Since the semiconductor device 1 has the runnerless mold package, a resin inflow inlet 35 is formed in the base 3, and is filled with a sealing resin 5. A lid member 6 formed with a metallic plate is disposed over the resin inflow inlet 35 filled with the sealing resin 5, so that the resin inflow inlet 35 is sealed.

A multi-layer wiring member 7 is disposed below the semiconductor chip 2 and the base 3. The multi-layer wiring member 7 has wiring layers 8 through 10 and insulating layers 11 and 12, which layers are alternately stacked. To the above layers, there are provided first mechanical bumps 13, second mechanical bumps 14 through 16 and mechanical via parts 17 and 18, which are essential parts of the present invention and serve as electrode parts.

The wiring layers 8 through 10 are made of a metallic material, which has a good spreading ability and a good electric conductivity. Examples of such metallic material is gold (Au) and copper (Cu). The wiring layers 8 through 10 have been patterned into predetermined shapes by an etching process, which will be described later. The insulating layers 11 and 12 are formed of a resin having insulating performance and a predetermined stiffness. Examples of such an insulating resin is epoxy resin and polyimide resin. Holes 20 are formed in the insulating layers 11 and 12 and are located in positions in which the electrodes 13 through 18 are to be formed.

The first mechanical bumps 13 out of the electrode parts provided on the multi-layered wiring member 7 are bumps for external connections to a mounting board (not shown) on which the semiconductor device 1 is to be mounted.

The first mechanical bumps 13 are formed so that the wiring layers 8 through 10 stacked via the insulating layers 11 and 12 as described above are defined by a plastic deformation process together via the holes 20 formed in the insulating layers 11 and 12, whereby the wiring layers 8 through 10 are projected outward (the downward direction in the figure). The wiring layers 8 through 10 are joined together and are electrically connected together in the positions in which the first mechanical bumps 13 are formed.

The second mechanical bumps 14–16 among the electrode parts formed on the multi-layered wiring member 7 are bumps connected to the semiconductor chip 2.

The second mechanical bumps 14 through 16 are formed in the same manner as the first mechanical bumps 13 so that the wiring layers 8 through 10 stacked via the insulating layers 11 and 12 as described above are deformed together via the holes 20 formed in the insulating layers 11 and 12. However, the direction in which the wiring layers 8 through 10 are deformed is selected so that the second mechanical bumps 14 through 16 project inward (the upward direction in the figure), in other words, toward the semiconductor chip 2.

In the embodiment of the present invention being considered, the second mechanical bump 14 is defined by deforming only the wiring layer 8 so that the second mechanical bump 14 projects toward the semiconductor chip 2. The second mechanical bump 15 is defined by deforming the wiring layers 8 and 9 together so that the second mechanical bump 15 projects toward the semiconductor chip 2. The third mechanical bump 16 is defined by deforming the wiring laggers 8, 9 and 10 together so that the third mechanical bump 16 projects toward the semiconductor chip 2. In the second mechanical bumps 15 and 16 obtained by deforming a plurality of wiring layers, the wiring layers are electrically connected together in the positions in which the second mechanical bumps 15 end 16 are formed.

The second mechanical bumps 14 through 16 are electrically connected to electrode pads (not shown) formed on the lower surface of the semiconductor chip 2, so that the semiconductor chip 2 and the multi-layered wiring member 7 are electrically connected together. The sealing resin 5 filled in the resin inflow inlet 35 is also filled in spaces between the second mechanical bumps 14 through 16 and the semiconductor chip 2, and functions to protect the junction portions of the second mechanical bumps 14 through 16 and the semiconductor chip 2.

The mechanical via parts 17 and 18 among the electrode parts formed on the multi-layered wiring member 7 are formed in the same manner as the first mechanical bumps 13 so that the wiring layers 8 through 10 stacked via the insulating layers 11 and 12 as described above are deformed together via the holes 20 formed in the insulating layers 11 and 12. However, like the second mechanical bumps 14 through 16, the direction in which the layers are deformed is selected so that the mechanical via parts 17 and 18 project inward (the upward direction in the figure), in other words, toward the semiconductor chip 2. The mechanical via parts 17 and 18 are used to electrically connect the layers of the multi-layered wiring member 7, and are not parts used to be connected to the chip mounting board or the semiconductor chip 2. Hence, the projecting direction of the via mechanical via parts 17 and 18 is not limited to the inward direction (upward direction), and may be the outward direction (downward direction).

In the embodiment of the present invention being considered, the mechanical via part 17 is formed by deforming only the wiring layer 9 to connect it to the wiring layer 8. The mechanical via part 18 is formed by deforming the wiring layers 9 and 10 together to connect it to the wiring layer 8. The mechanical via parts 17 and 18 make it possible to establish the interlayer connections in the multi-layered wiring member 7, and have the same functions as the via holes or through holes.

With the above-mentioned structure of the semiconductor device 1 having the wiring layers 8 through 10 and the insulating layers 11 and 12 alternately stacked, it is possible to form the electrode parts, namely the first mechanical bumps 13, the second mechanical bumps 14 through 16 and the mechanical via parts 17 and 18 by deforming one or a plurality of wiring layers 8 through 10 together via the holes 20 formed in the insulating layers 11 and 12.

The holes 20 of the multi-layered wiring member 7 are formed in only the insulating layers 11 and 12, and are not formed in the wiring layers 8 and 10. That is, the multi-layered wiring member 7 does not have through holes. Hence, it is possible to prevent the decrease in mechanical strength of the multi-layered wiring member even if the electrode parts 13 through 18 are finely arranged. As a result, the integration density can be improved and down-sizing of the semiconductor device 1 becomes possible.

The wiring layers 8 through 10 of the multi-layered wiring member 7 are connected together by means of the electrode parts 13 through 18, which function in the same manner as the conventional via holes or through holes. In addition, the electrode parts 13 through 18 can easily be formed less-expensively by the deformation process. As a result, it is possible to very easily form the electric connection structure for the multiple layers by means of the electrode parts 13 through 18. The formation of the electrode parts 13 through 18 is possible at a high yield rate. This also contributes to reduction of the cost of producing the semiconductor device 1.

A description will now be given, with reference to FIGS. 2A through 2I, of the method of producing the multi-layered wiring member 7. For the sake of convenience, the following description relates to the method of producing the multi-layered wiring layer 7 simplified so that it consists of two layers, that is, an insulating layer 21 and a wiring layer 22.

Figure 2A:
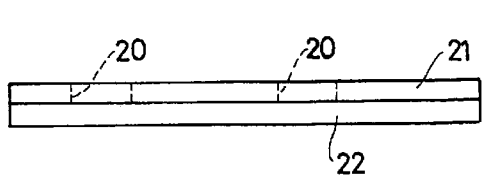
FIGS. 2A, 2B, 2C, 2D, 2E, 2F, 2G, 2H and 2I are diagrams of a method of producing a multi-layered wiring member.
Figure 2B:
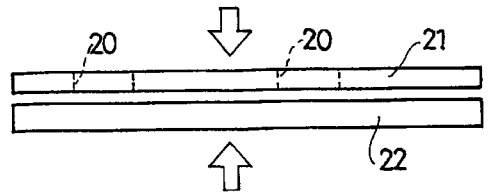

FIGS. 2A and 2B show the steps of layering the insulating layer 21 and the wiring layer 22 before patterning. Either the step shown in FIG. 2A or the step shown in FIG. 2B can be employed. More particularly, FIG. 2A shows that the layers 21 and 22 are stacked by coating, by means of screen printing or the like, the insulating layer 21 on the wiring layer 22 of a plate shape before patterning. When patterning the insulating layer 21 by the screen printing, a mask or the like is used so that the holes 20 are formed in positions in which the electrodes are to be formed. FIG. 2B shows the step of separately preparing the plate-shaped wiring layer 22 made of an electrically conductive material and the insulating layer 21 in which the holes 20 have been formed in positions in which the electrodes are to be formed and laying the latter layer on top of the former layer.

Figure 2C:

After the insulating layer 21 and the wiring layer 22 before patterning are joined together, the step shown in FIG. 2C is carried out. In this step, a resist film 84 is arranged on the wiring layer 22 so that predetermined surface portions on which the wiring layer 22 still remain in the multi-layered wiring member 7 are masked.

Figure 2D:
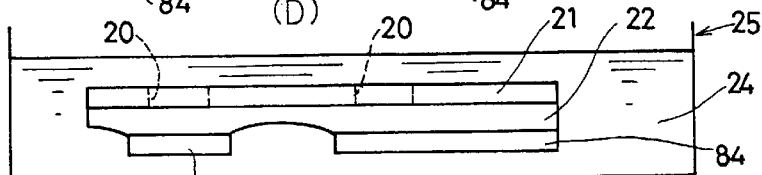
Figure 2F:
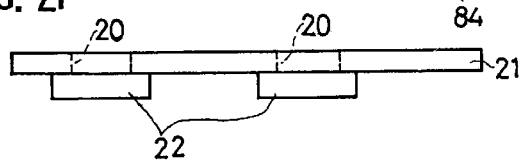
Figure 2E:
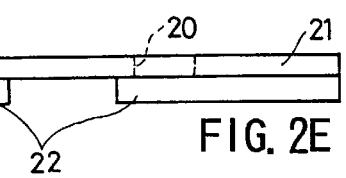

After arranging the resist 834 on the wiring layer 22, subsequently as shown in FIG. 2D, the insulating layer 21 and the wiring layer 22 are placed into an etching chamber 25 filled with an etching liquid (etchant) 24. Hence, surface portions of the wiring layer 22 which are not covered by the resist 84 are removed. FIG. 2E shows the insulating layer 21 and the wiring layer 22 after the above etching process is completed. FIG. 2F shows the insulating layer 21 and the wiring layer 22 on which a wiring pattern different from that shown in FIG. 2E is formed by the steps shown in FIGS. 2A through 2D. In the above-mentioned etching process, it is possible to provide an etching-resistant coating member or an etching-resistant protection film on the insulating layer 21 in order to protect the insulating layer 21 before the layers 21 and 22 are placed into the etching liquid 24.

Figure 2G:
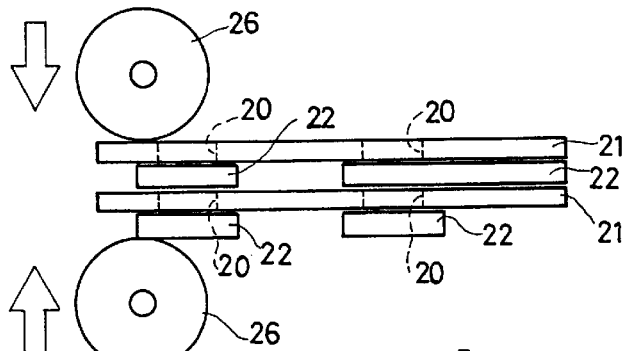
Figure 2H:
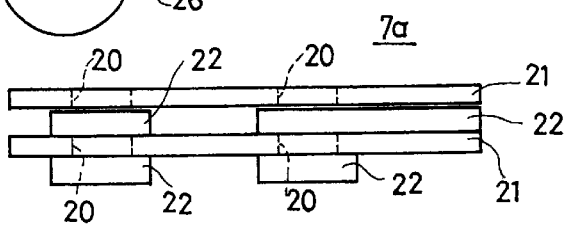

FIG. 2G shows a state in which a stacked layer composed of the insulating layer 21 and the wiring layer 22 shown in FIG. 2E and a stacked layer composed of the insulating layer 21 and the wiring layer 22 shown in FIG. 2F are joined together by means of a pair of laminating rolls 26. The holes 20 formed in the two stacked layers are positioned so as to face each other. FIG. 2H shows a multi-layered wiring member 7a composed of the two joined stacked layers before the electrode parts are formed.

Figure 2I:
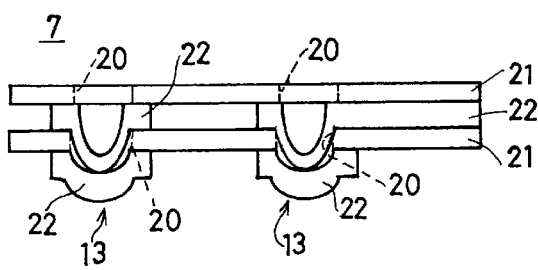

Then, the electrode parts are formed in an electrode forming process which will be described later, and the multi-layered wiring member 7 shown in FIG. 2I, in which the first mechanical bumps 13 are formed as electrode parts.

The above-mentioned method of producing the multi-layered wiring member 7 can be performed by established, general-purpose techniques such as the screen printing process, the plating process and the thermal crimping method. Hence, the method can be simply carried out by a simple production facility. That is, there is no difficultly in the production of the multi-layered wiring member 7. As a result, the multi-layered wiring member 7 thus produced is less expensive. A vacuum press apparatus or the like can be used instead of the laminating rolls 26 used to join the stacked layers shown in FIGS. 2E and 2F together.

A description will now be given of the method of forming the electrode parts 13 through 18. First of all, the method of forming the first mechanical bumps 13 and the second mechanical bumps 14 through 16 will be described with reference to FIGS. 3A through 11B. As has been described previously, the basic method of forming first mechanical bumps 13 are the same as that of forming the second mechanical bumps 14 through 16 except for the direction of occurrence of deformation. That is, the first mechanical bumps 13 project outward, while the second mechanical bumps 14 through 16 project inward. Hence, by way of example, a description will now be given of the method of forming the first mechanical bumps 13. For the sake of convenience, the following description given in conjunction with FIGS. 3A through 9D relates to the method of producing the multi-layered wiring layer 7 simplified so that it consists of three layers, that is, the insulating layer 21 and two wiring layers 22 and 23.

Figure 3A:
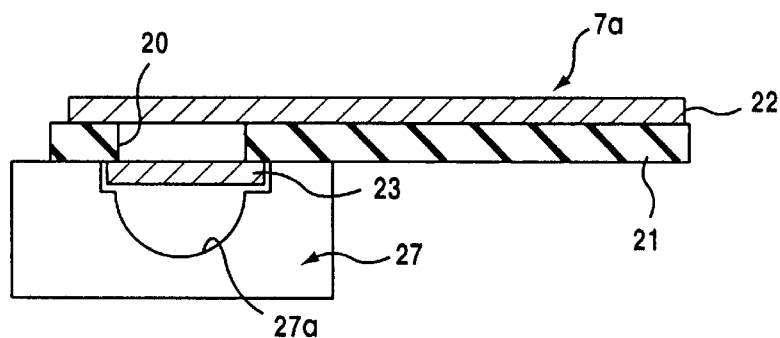
FIGS. 3A, 3B and 3C are diagrams of a method of forming a first mechanical bump.
Figure 3B:
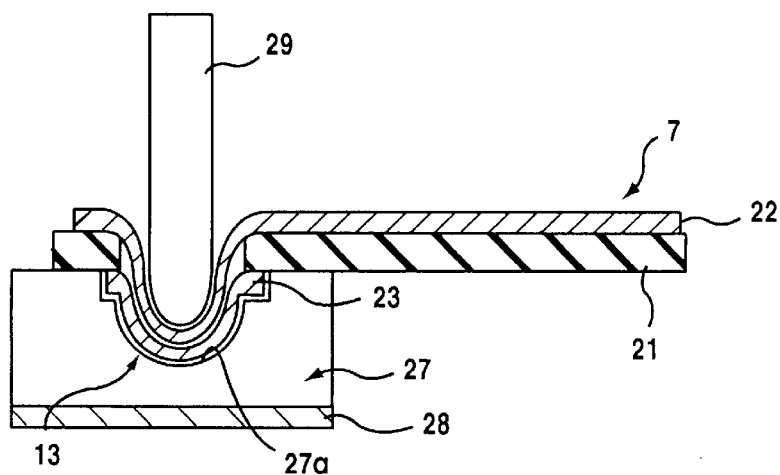
Figure 3C:
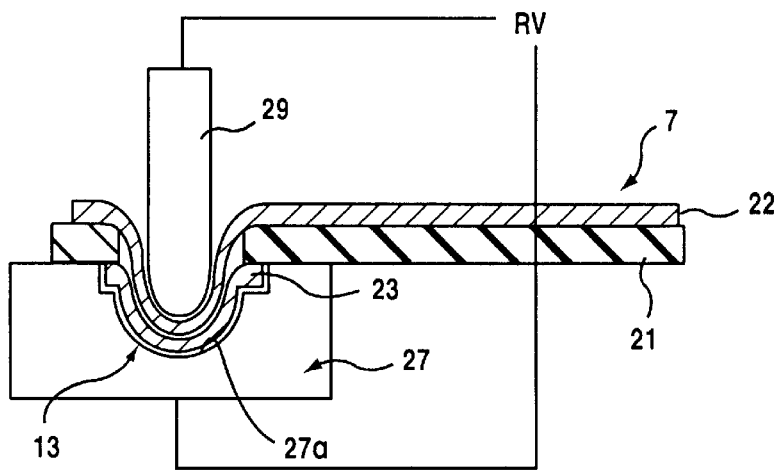

FIGS. 3A, 3B and 3C show the basic steps of the method of forming the first mechanical bumps (electrode parts) 13. As shown in FIG. 3A, the multi-layered wiring member 7a formed by the above-mentioned method before the electrode parts are formed is placed on the upper part of a mechanical bump mold or die 27. As shown in FIG. 3A, the mechanical bump mold 27 has a cavity corresponding to the shape of the first mechanical bumps 13 to be formed. When placing the multi-layered wiring member 7a before the formation of the electrode parts, the member 7a is positioned so that the center of the hole 20 formed in the insulating member 21 coincides with the center or the cavity 27a.

Subsequently, as shown in FIG. 3B, a punch 29 is descended toward the cavity 27a of the mechanical bump mold 27 from the upper side of the multi-layered wiring member 7a. The punch 29 functions to deform the wiring layers 22 and 23 exposed via the hole 20 at one time, so that the first mechanical burp 13 having a semi-spherical shape is formed. In order to facilitate forming of the first mechanical bump 13 in the above process, a heater 28 for heating the mechanical bump mold 27 is provided below the mold 27.

The first mechanical bump 13 can be formed by only simple tools such as the mechanical bump mold 27 and the punch 29. Hence, there is no difficulty in formation of the first mechanical bump 13 in the multi-layered wiring member 7. This contributes to reduction in the production cost.

By deforming the wiring layers together, the wiring layers 22 and 23 can be electrically connected together. In order to increase the reliability of joining the wiring layers 22 and 23, as shown in FIG. 3C, it is possible to apply a voltage across the mechanical bump mold 27 and the punch 29 to weld them together in such a way that the punch 29 serves as a welding electrode.

Figure 4A:
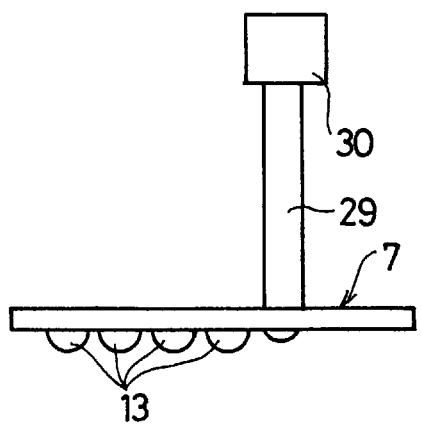
FIGS. 4A, 4B, 4C and 4D are diagrams of a method of forming a plurality of first mechanical bumps.
Figure 4B:
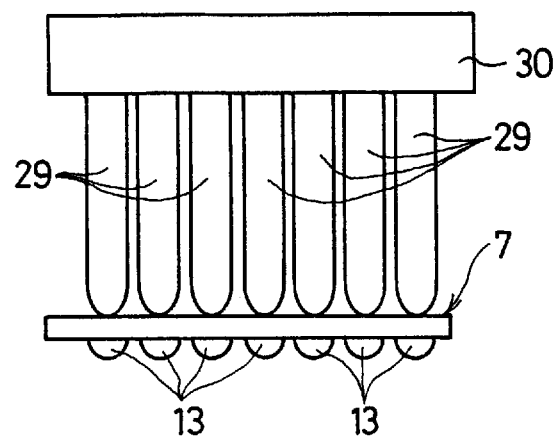

FIGS. 4A, 4B, 4C and 4D show the method of forming a plurality of first mechanical bumps 13 in the multi-layered wiring member 7. In order to form a plurality of first mechanical bumps 13 on the multi-layered wiring member 7, as shown in FIG. 4A, the punch 29 is provided on a first movable upper die 30. The first mechanical bumps 13 are formed one by one while the movable upper die 30 is being moved. Alternatively, a plurality of punches 29 are formed on the first movable upper die 30, as shown in FIG. 4B. The first mechanical bumps 13 are simultaneously formed by the punches 29 at one time.

Figure 4C:
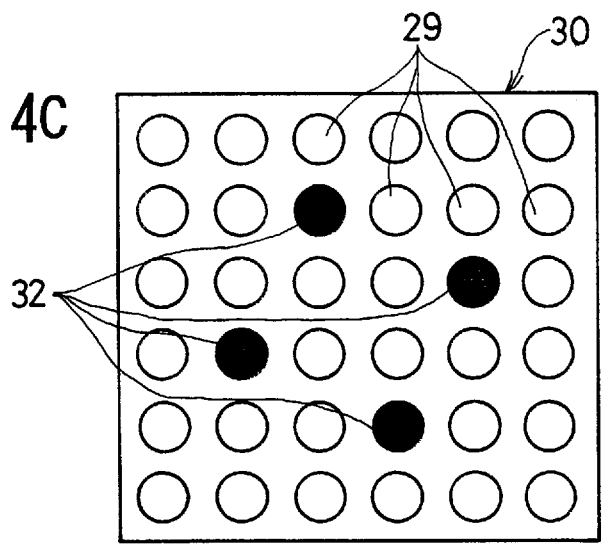
Figure 4D:
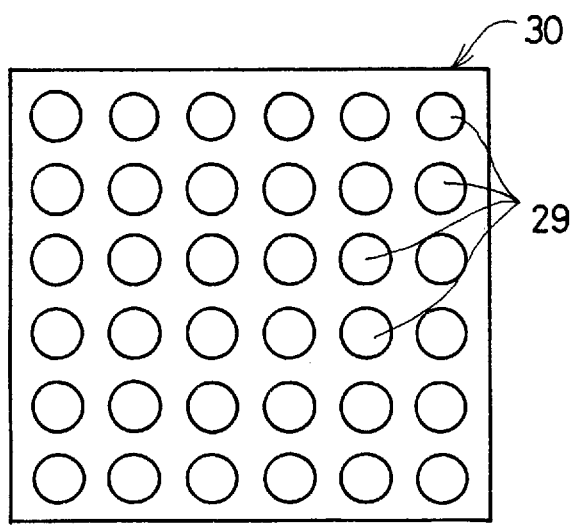

FIGS. 4C and 4D are plan views of the first upper die 30. As shown in these figures, the punches 29 are arranged so as to form a predetermined arrangement pattern (for example, a matrix pattern, a zigzag pattern or another arbitrary pattern). In a case where there are portions that do not need the first mechanical bumps 13, punches 29 are not provided in corresponding surface portions 32 on the upper die 30, as indicated by filled circles in FIG. 4C. The punches 29 can be supported to the upper die 30 so as to be replaced by other punches 29. With this structure, it is possible to selectively use punches having different lengths or different thicknesses. FIG. 4D shows the upper die 30 having no surface portions corresponding to the portions 32 shown in FIG. 4C.

Figure 5A:
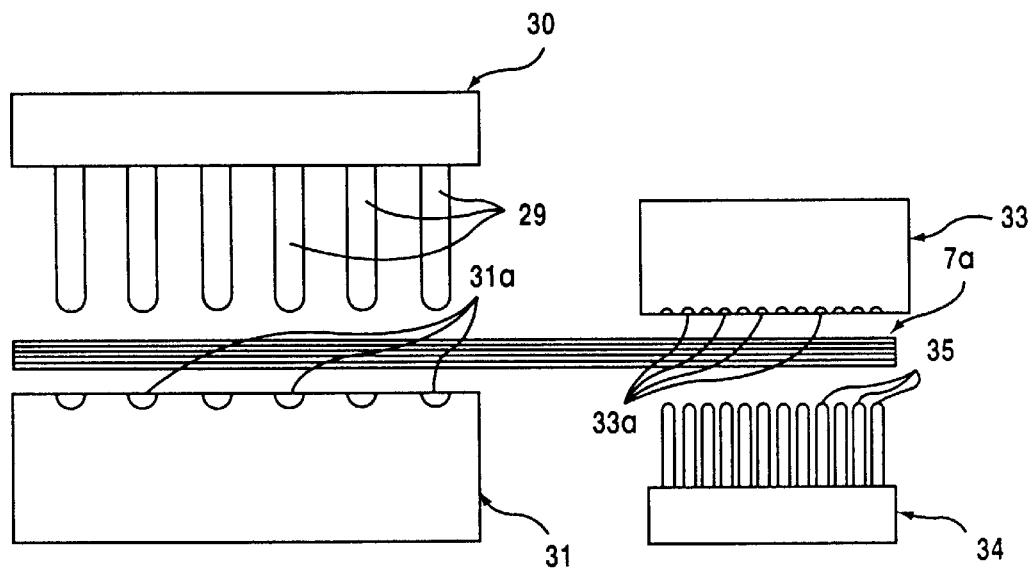
FIGS. 5A, 5B and 5C are diagrams of a method of forming first mechanical bumps and second mechanical bumps together.
Figure 5B:
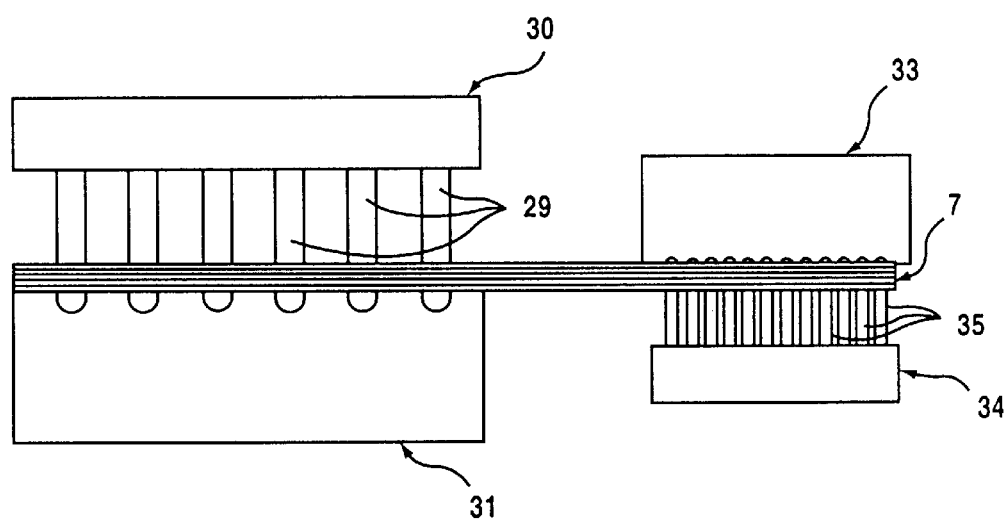
Figure 5C:
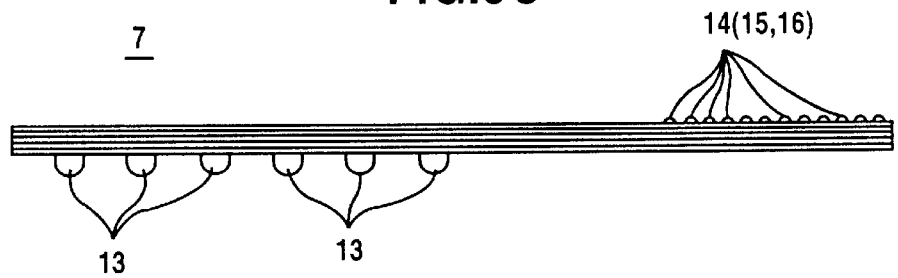

FIGS. 5A, 5B and 5C show the method of simultaneously forming the first mechanical bumps 13 and the second mechanical bumps 14 through 16 at one time.

In order to form the first and second mechanical bumps 13–16 at one time, there are prepared the first upper die 30 and a first lower die (mechanical bump mold) 31 for forming the first mechanical bumps 13, and a second upper die 33 (mechanical bump mold) and a second lower die 34 for forming the second mechanical bumps 14 through 16. The first lower die 31 has holes corresponding to the punches 29. As has been described previously, the projecting direction of the first mechanical bumps 13 is opposite to that of the second mechanical bumps 14 through 16. With the above in mind, a plurality of punches 29 for forming the first mechanical bumps 13 are supported to the first upper die 30, and a plurality of punches 35 for forming the second mechanical bumps 14 through 16 are supported to the second lower die 34. The second upper die 33 has holes corresponding to the punches 35.

By means of a driving mechanism (not shown) capable of simultaneously driving the dies 30 through 34, it is possible to simultaneously form the first and second mechanical bumps 13 through 16 on the multi-layered wiring member 7 at one time. FIG. 5C shows the multi-layered wiring member 7 having the first mechanical bumps 13 and the second mechanical bumps 14 through 16 which bumps are formed at one time by the above-mentioned method.

As described above, it is possible to simultaneously form electrode parts of different types (the first mechanical bumps 13 and the second mechanical bumps 14 through 16). When forming the first mechanical bumps 13 and the second mechanical bumps 14 through 16, the mechanical vial parts 17 and 18 can be simultaneously formed. Hence, the electrode parts 13 through 18 can be formed with high productivity.

Figure 6A:
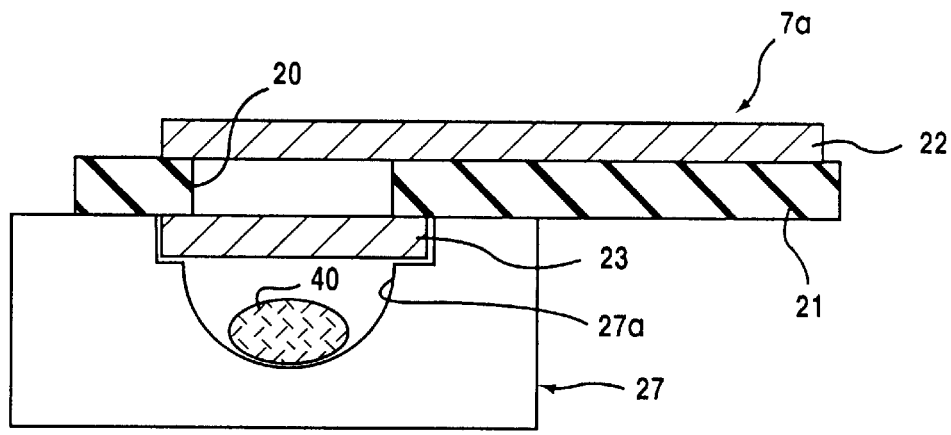
FIGS. 6A, 6B and 6C are diagrams of a first variation of the method of forming the first mechanical bump shown in FIGS. 3A through 3C.
Figure 6B:
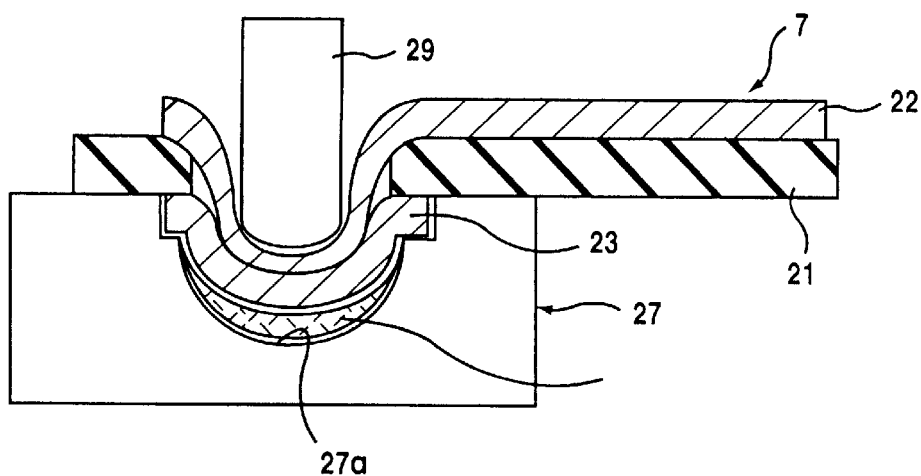
Figure 6C:
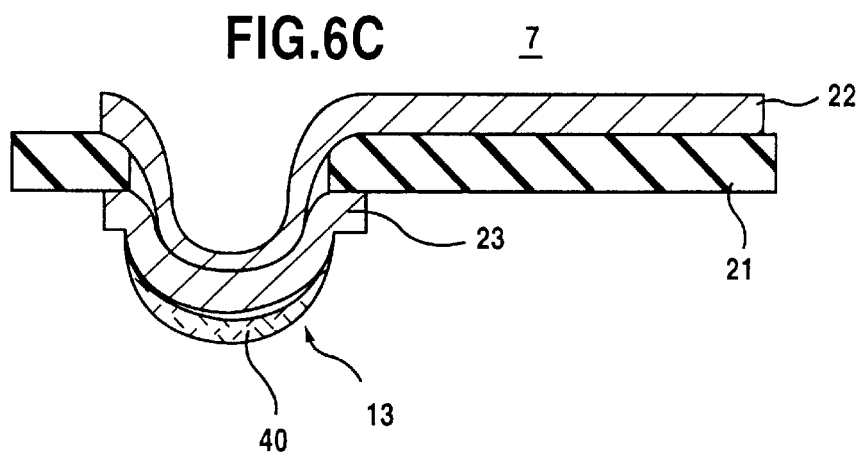

FIGS. 6A, 6B and 6C show a first variation of the method of forming the first mechanical bumps 13. As shown in FIG. 6A, a solder member 40 is provided in the cavity 27a of the mechanical bump mold 27 before the first mechanical bumps 13 are deformed.

When deforming the wiring layers 22 and 23 together by the punch 29, the wiring layer 23 is strongly pressed to the member 40, which is joined to the wiring layer 23. Hence, as shown in FIG. 6C, the multi-layered wiring member 7 is formed so that the member 40 is located in the outermost position in the direction of occurrence of deformation (lower side in the figure).

By providing the member 40 in the outermost position in the deforming direction, it becomes possible to reduce the depth of punching (the amount of projection) when forming the first mechanical bump 13 by the deformation process. In addition, it is possible to reduce the load applied to the wiring layers 22 and 23 forming the first mechanical bump 13. Further, it is possible to improve the performance of joining the semiconductor device 1 on a chip mounting board (not shown). The member 40 is not limited to the first mechanical bumps 13 but may be applied to the second mechanical bumps 14 through 16.

Figure 7A:
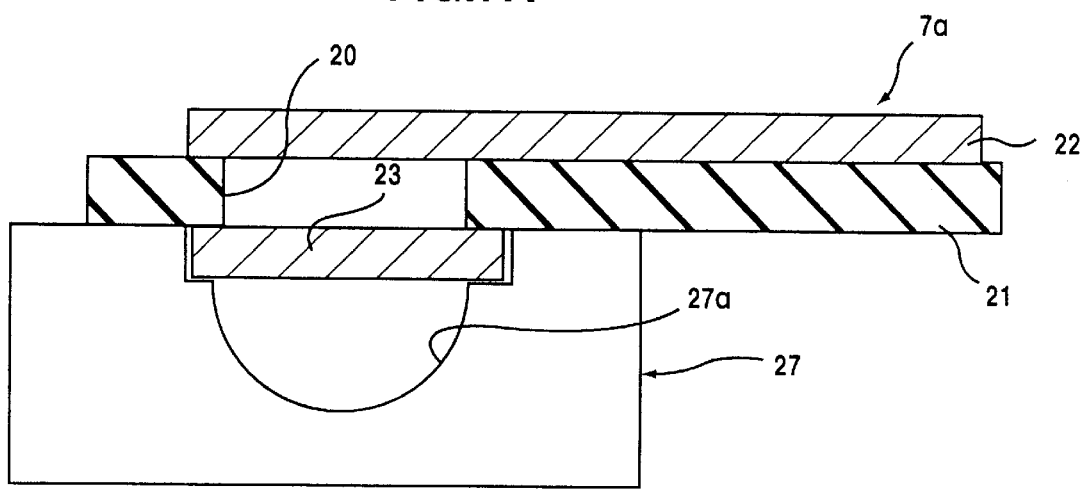
FIGS. 7A, 7B and 7C are diagrams of a second variation of the method of forming the first mechanical bump shown in FIGS. 3A through 3C.
Figure 7B:
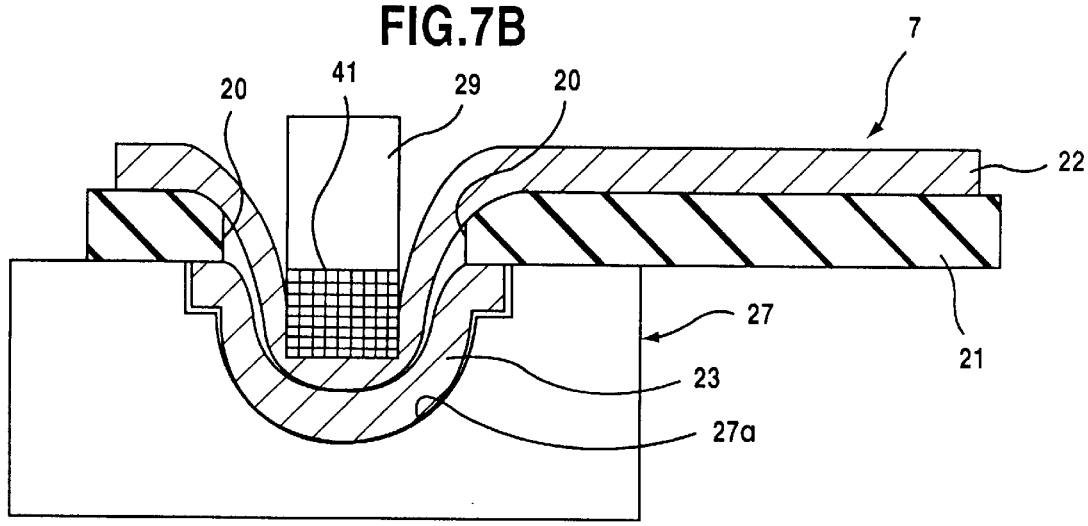
Figure 7C:
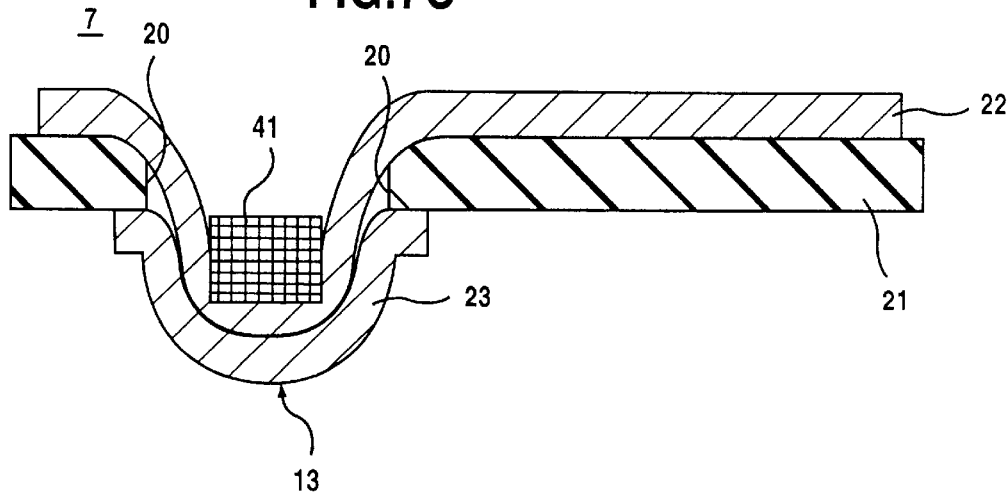

FIGS. 7A, 7B and 7C show a second variation of the method of forming the first mechanical bumps 13. The second variation is characterized in that a reinforcement member 41 is provided between the punch 29 and the wiring layer 22 when deforming the first mechanical bump 13, as shown in FIG. 7B.

The reinforcement member 41 is a metallic block made of, for example, aluminum (Al) or copper (Cu). As shown in FIG. 7A, the multi-layered wiring member 7a is placed on the mechanical bump mold 27 before the electrode parts are formed, and thereafter the reinforcement member 41 is placed on the wiring layer 22 located above the cavity 27a. Alternatively, the reinforcement member 41 is provisionally attached to the end of the punch 29, and the deformation process is carried out, as shown in FIG. 7B.

When the deformation process is carried out using the reinforcement member 41, the reinforcement member 41 is buried inside of the first mechanical bump 13, as shown in FIG. 7C. The reinforcement member 41 functions to improve the mechanical strength of the first mechanical bump 13 and to prevent spring-back (elastic restoration) of the wiring layers 22 and 23 at the time of the deformation process. Hence, it is possible to maintain the original shape of the first mechanical bump 13. It will be noted that the reinforcement member 41 is not limited to the first mechanical bumps 13 but is applicable to electrode parts having other structures, such as; the second mechanical bumps 14 through 16 and the mechanical via parts 17 and 18.

Figure 8A:
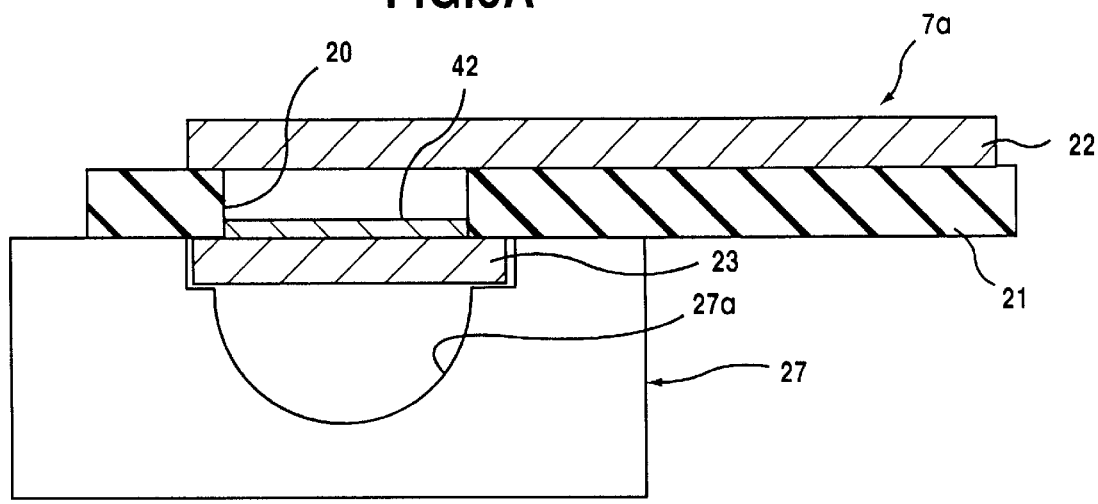
FIGS. 8A, 8B and 8C are diagrams of a third variation of the method of forming the first mechanical bump shown in FIGS. 3A through 3C.
Figure 8B:
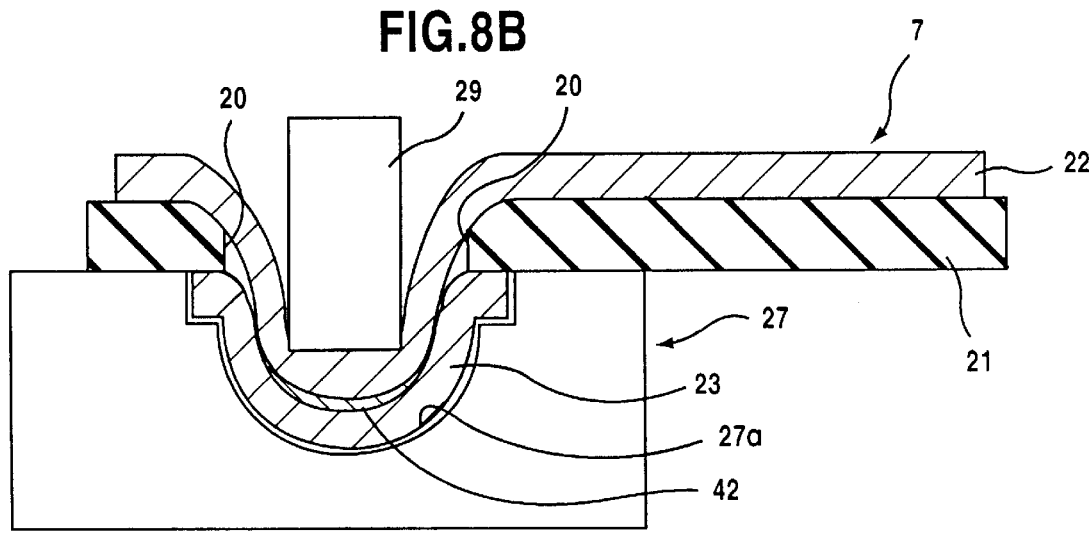
Figure 8C:
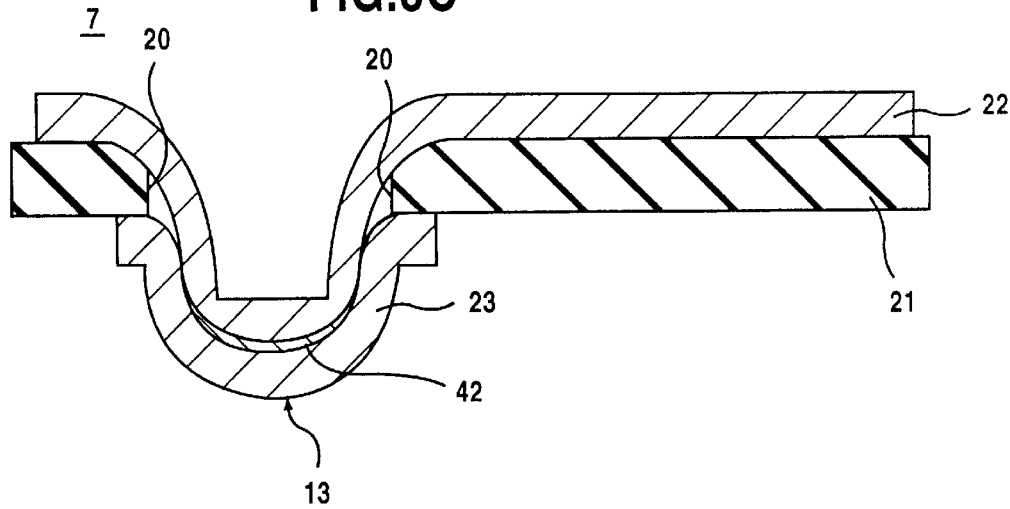

FIGS. 8A, 8B and 8C show a third variation of the method of forming the first mechanical bumps 13. According to the third variation, as shown in FIG. 8A, a metallic plating layer 42 is formed before the first mechanical bump 13 is formed by the deformation process. The metallic plating layer 42 is placed on the wiring layer 23 and is located below the hole 20 formed in the insulating layer 21.

The metallic plating layer 42 is, for example, solder plating, aluminum (Al) plating or tin (Sn) plating. The metallic plating layer 42 may be formed before the wiring layer 23 is formed, or when the wiring layer 23 is stacked on the insulating layer 21.

When the deformation process is carried out using the metallic plating layer 42 provided on the wiring layer 23, as shown in FIG. 8B, the metallic plating layer 42 is sandwiched between the wiring layer 22 and the wiring layer 23. Then, as shown in FIG. 8C, the metallic plating layer 42 is crushed between the wiring layers 22 and 23, and makes sure the electric connection between these layers. In addition, the metallic plating layer 42 improves the mechanical junction between the wiring layers 22 and 23.

The metallic plating layer 42 is not limited to the first mechanical bumps 13, but is applicable to electrode parts having other structures, such as the second mechanical bumps 14 through 16 and the mechanical via parts 17 and 18. The position of formation of the metallic plating layer 42 is not limited to the surface of the wiring layer 23, but can be on the wiring layer 22. Further, instead of the plating metallic layer 42, a metallic layer formed by evaporation, sputtering or printing can be used.

Figure 9A:
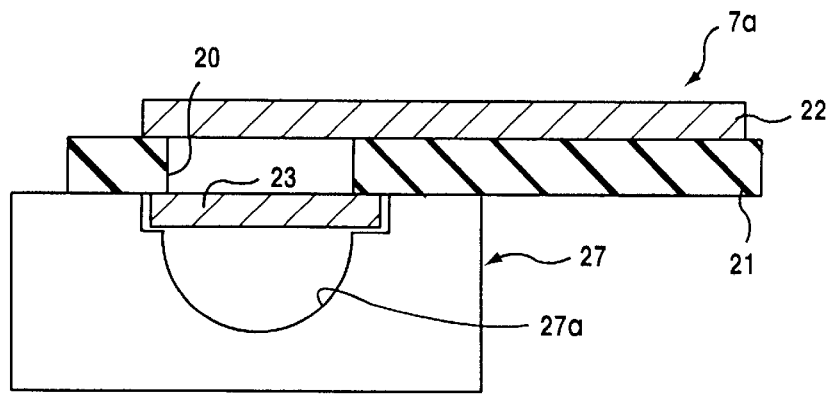
FIGS. 9A, 9B, 9C and 9D are diagrams of a fourth variation of the method of forming the first mechanical bump shown in FIGS. 3A through 3C.
Figure 9B:
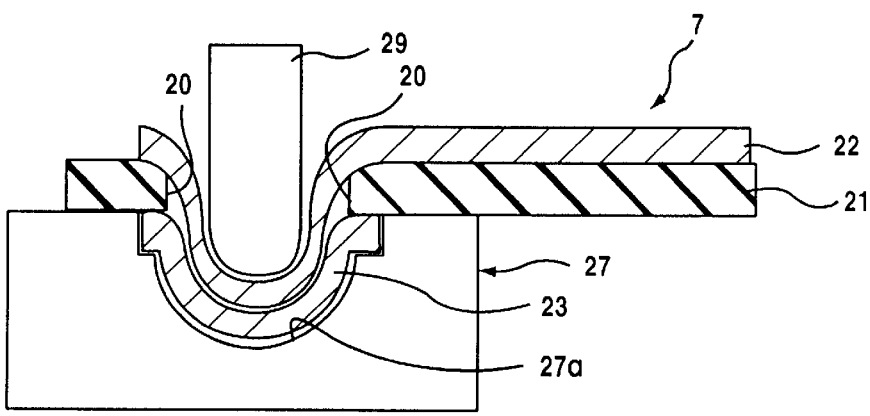
Figure 9C:
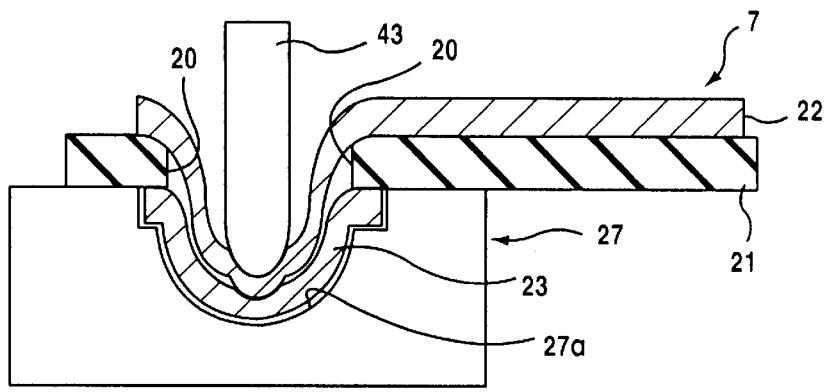
Figure 9D:
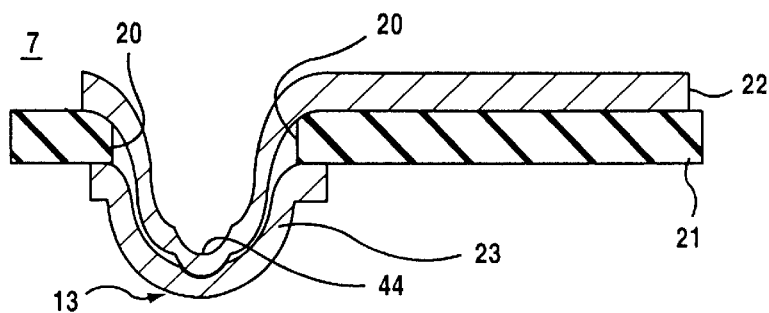

FIGS. 9A through 9D show a fourth variation of the method of forming the first mechanical bumps 13. According to the fourth variation, the first mechanical bump 13 is defined, as shown in FIGS. 9A and 9B, by means of the punch 29 in the same manner as shown in FIGS. 3A through 3C. Then, as shown in FIG. 9C, an engagement recess portion 44 is defined in the center of the first mechanical bump 13 by using a punch 43 having a less diameter than the punch 29 used for formation of the first mechanical bump 13 (embossing process). FIG. 9D shows the multi-layered wiring member 7 having the first mechanical bump 13 in which the engagement recess portion is formed.

The engagement recess portion 44 functions to improve the mechanical strength of the wiring lines 22 and 23 and make sure the junction of the wiring layers 22 and 23.

The engagement recess portion 44 is not limited to the first mechanical bumps 13, but is applicable to electrode parts of other structures, such as the second mechanical bumps 14 through 16 and the mechanical via parts 17 and 18.

Figure 10A:
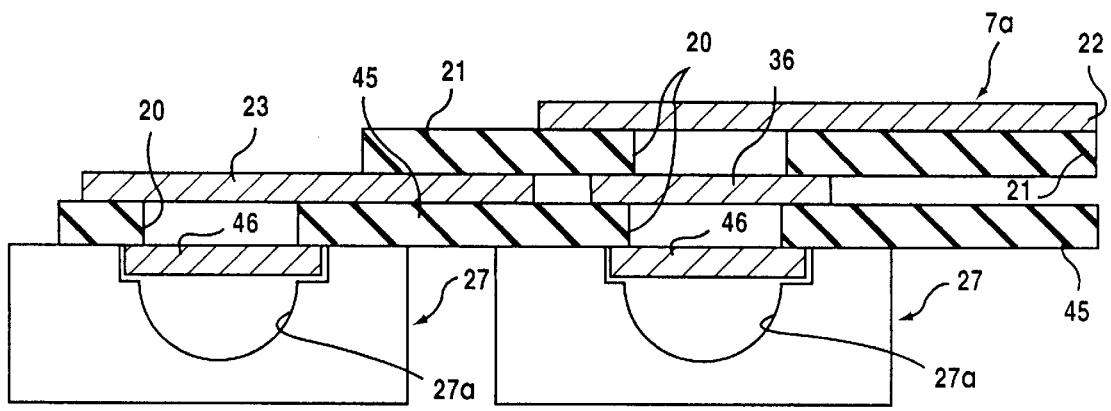
FIGS. 10A, 10B and 10C are diagrams of a method of forming the first mechanical bump in a multi-layered wiring member having an intermediate wiring layer.
Figure 10B:
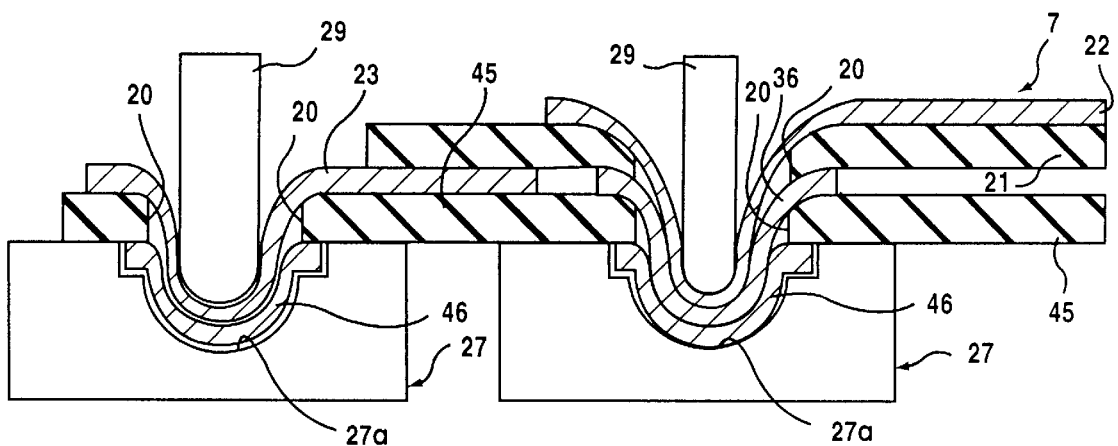
Figure 10C:
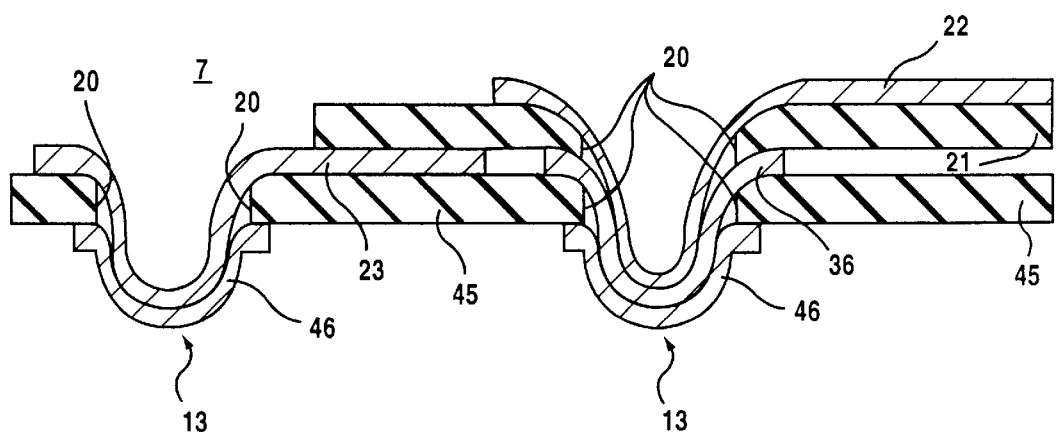

FIGS. 10A, 10B and 10C show a method of forming the first mechanical bumps 13 in the multi-layered wiring member 7a having three wiring layers 22, 23 and 46. As shown in FIG. 10A, the aforementioned two-layer wiring member located on the left side of the drawing and a three-layer wiring member located on the right side thereof are joined together.

It will now be assumed that the wiring layer 22 is to be electrically connected to the wiring layer 46. The wiring layer 22 is the uppermost layer, and the wiring layer 46 is the lowermost layer. Hence, there is a long distance between the wiring layer 22 and the wiring layer 46. If simply deforming the wiring lines 22 and 46 by using the punch 29, the uppermost wiring layer 22 will be deformed greatly and broken due to large stress generated therein.

With the above in mind, an intermediate wiring layer 36 is interposed between the uppermost wiring layer 22 and the lowermost wiring layer 46 in order to prevent large stress from being generated in the uppermost wiring layer 22. As shown in FIG. 10B, when the first mechanical bumps 13 are defined by means of the punches 29, large stress is prevented from being generated in the wiring layer 22, which is thus prevented from being broken. FIG. 10C shows the multi-layered wiring member 7 having the first mechanical bump 13 thus formed.

The intermediate wiring layer 36 is not limited to the first mechanical bumps 13, but is applicable to electrode parts of other structures, such as the second mechanical bumps 14 through 16 and the mechanical via parts 17 and 18.

Figure 11A:
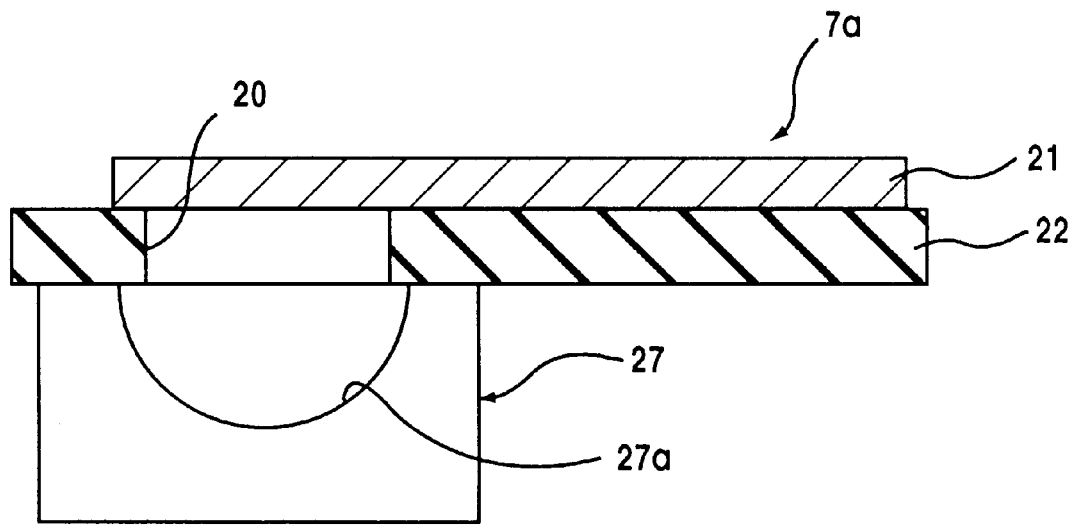
FIGS. 11A and 11B are diagrams of a method of forming the first mechanical bump in a multi-layered wiring member having a single wiring layer and a single insulating layer.
Figure 11B:
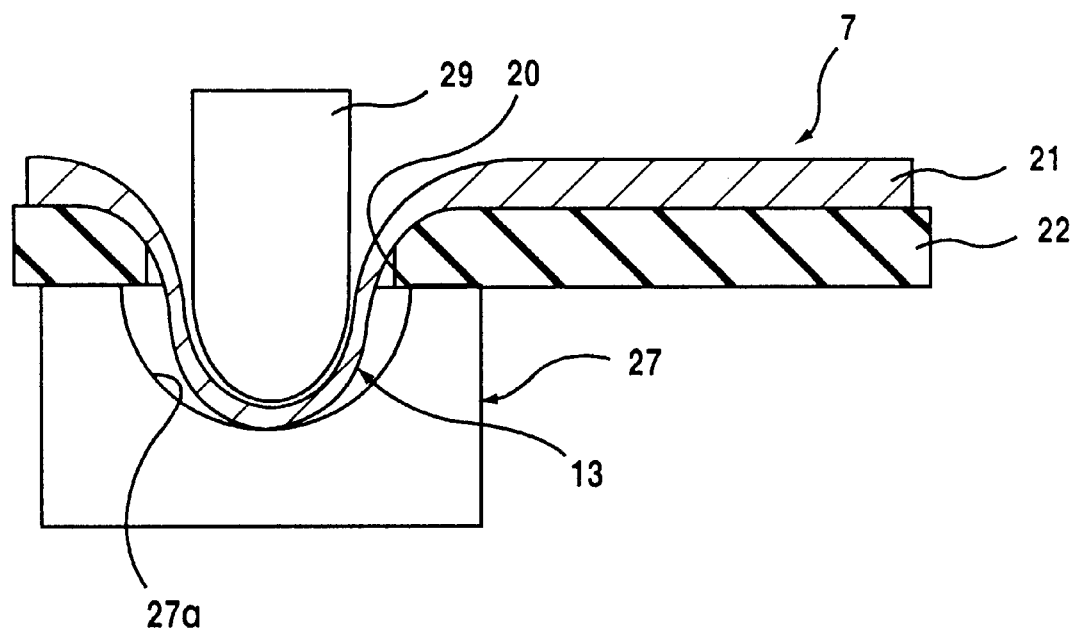

In the above-mentioned methods of forming the electrode parts, the electrodes parts are formed in the multi-layered wiring member 7. However as shown in FIGS. 11A and 11B, the above-mentioned methods can be applied to a wiring member having the single wiring layer 22 provided on the insulating layer 21.

Figure 12A:
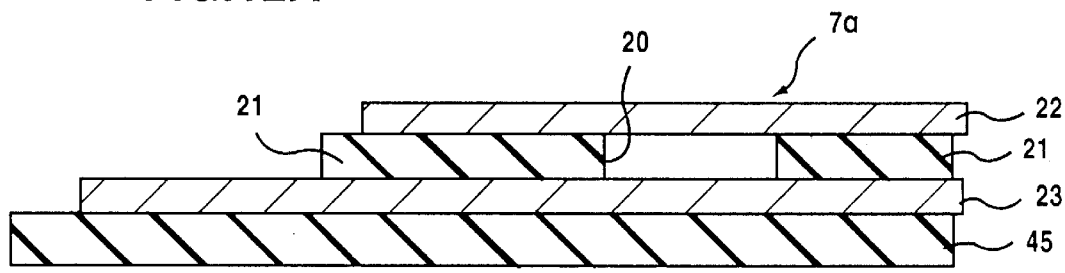
FIGS. 12A and 12B are diagrams of a method of forming a mechanical via part.
Figure 12B:
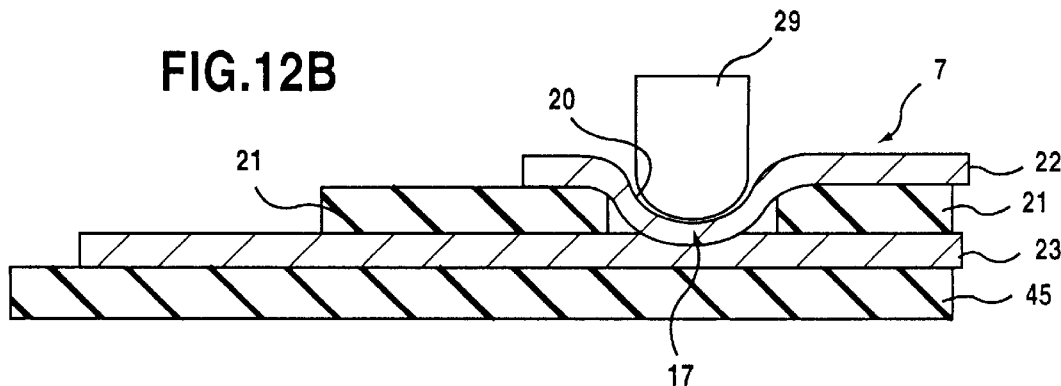
Figure 13A:
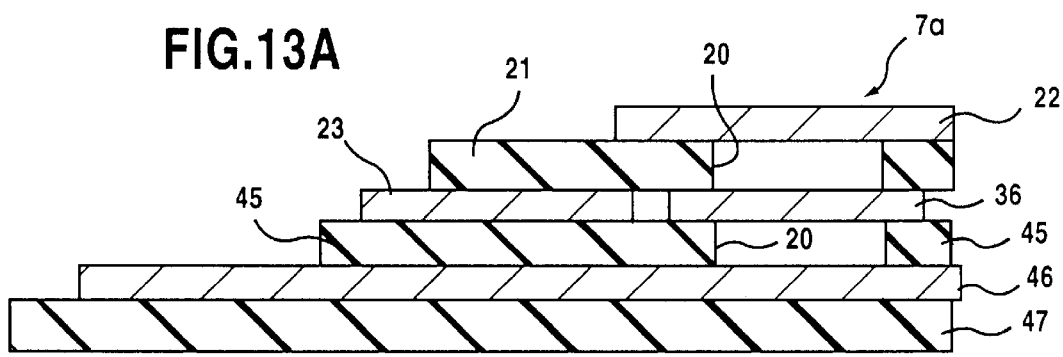
FIGS. 13A and 13B are diagrams of another method of forming the mechanical via part.
Figure 13B:
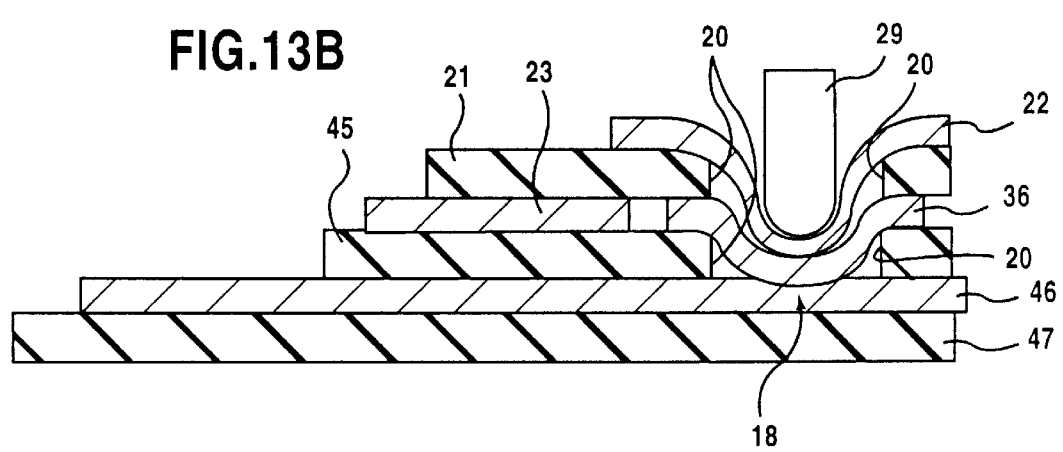

FIGS. 12A, 12B, 13A and 13B show a method of forming the mechanical via parts 17 and 18. More particularly, FIGS. 12A and 12B show a method of connecting the two wiring layers 21 and 23 together, and FIGS. 13A and 13B show a method of connecting wiring layers 21 and 46 together in the three-layer wiring structure.

The method of connecting the two wiring layers 22 and 23 shown in FIGS. 12A and 12B is almost he same as the method of forming the first mechanical bump 13 shown in FIGS. 3A through 3C except for the following. In the method of forming the first mechanical bump 13, it is defined so as to greatly project outward for the external connection. On the other hand, the mechanical via parts 17 and 18 are sufficient to establish electrical connections within the multi-layered wiring member 7. Hence, as shown in FIG. 12B, the mechanical via part 17 is defined by deforming only the wiring layer 22 by means of the punch 29, so that the wiring layer 22 is electrically connected to the wiring layer 23.

The method of connecting the three wiring layers 22, 23 and 46 shown in FIGS. 13A and 13B is almost the same as the method of forming the first mechanical bump 13 shown in FIGS. 10A, 10B and 10C (the bump 13 on the right side thereof). As has been described previously, in the method shown in FIGS. 10A, 10B and 10C, the intermediate wiring layer 36 is interposed between the uppermost wiring layer 22 and the lowermost wiring layer 46 in order to prevent large stress from being generated in the wiring layer 22. The mechanical via part 18 is sufficient to connect the wiring layers 22 and 46 together within the multi-layered wiring member 7. Hence, as shown in FIG. 13B, only the wiring layer 22 and the intermediate wiring layer 36 are deformed by the punch 29, whereby the intermediate layer 36 is connected to the lowermost wiring layer 46.

The mechanical via parts 17 and 18, which function as via conventional holes or through holes, can be easily defined by only the deforming process, and do not need conventional troublesome, less-expensive processes such as the hole forming process and the plating process. Hence, the production cost of the semiconductor device 1 is cheap.

Figure 14B:
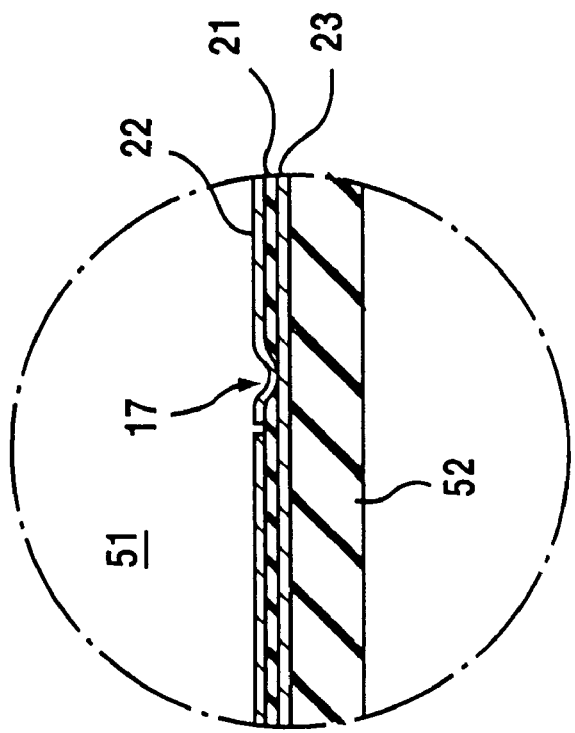
FIG. 14A and 14B are diagrams of a mounting wiring board to which the present invention is applied.
Figure 14A:
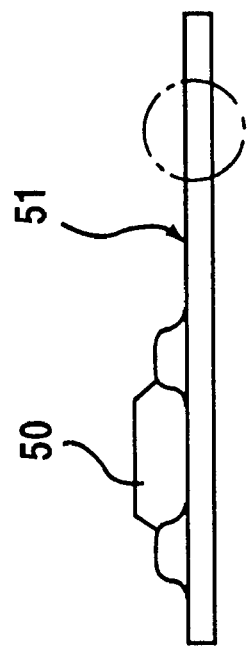

FIG. 14 is a diagram of a chip mounting board 51 to which the techniques provided by the present invention are applied, a semiconductor device 50 being mounted on the chip mounting board 51. The chip mounting board 51 shown in FIG. 14 has a structure in which the wiring layer 23, the insulating layer 21 and the wiring layer 22 are stacked in the same manner as the aforementioned multi-layered wiring board 7. The present invention is suitably applicable to the chip mounting board 51 having the mechanical via part 17 electrically connecting the stacked wiring layers.

Figure 15:
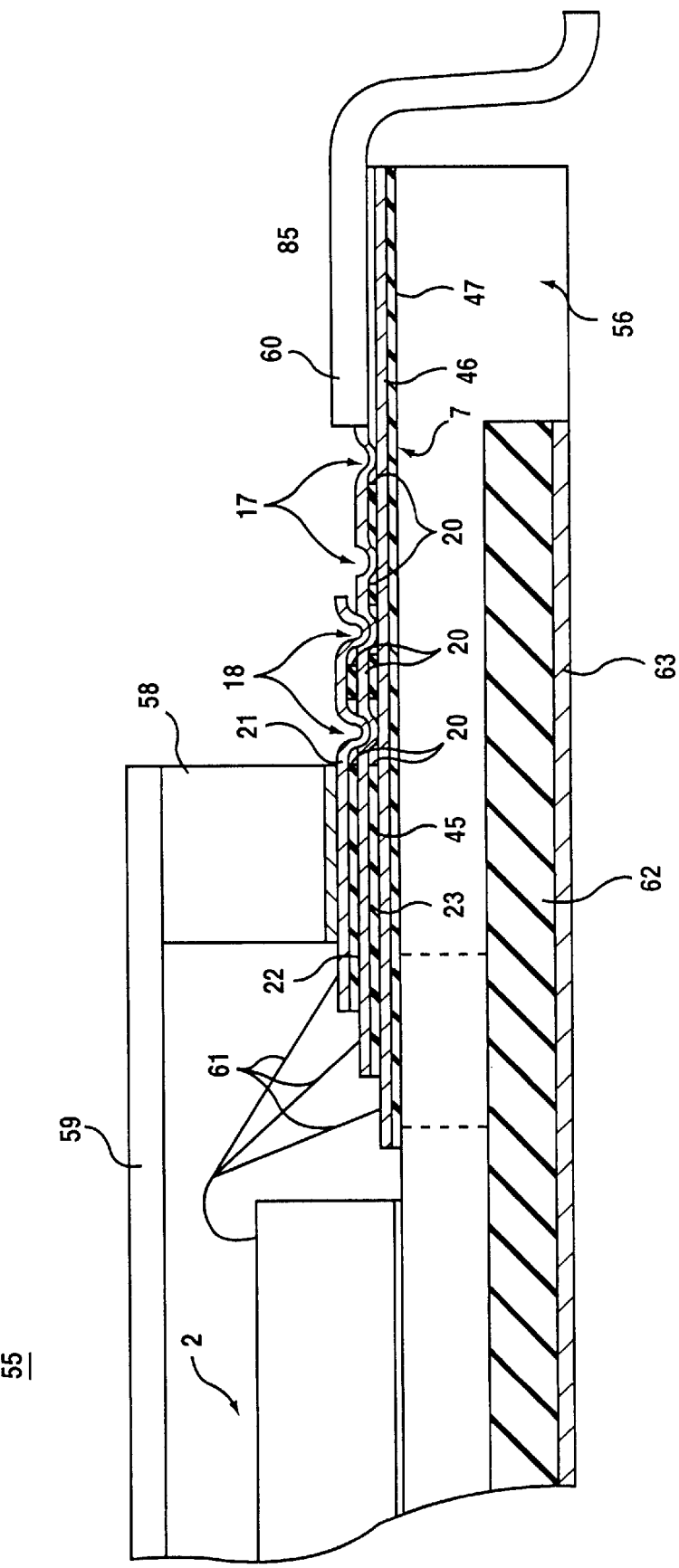
FIG. 15 is a diagram showing a semiconductor device of a runner mold package to which a multi-layered wiring member having the structure shown in FIGS. 13A and 13B.

FIG. 15 shows that the multi-layered wiring member 7 having the structure shown in FIGS. 13A and 13B is applied to a semiconductor device 55 having the runnerless mold package structure.

The semiconductor device 55 has a base 56 having a bottom portion in which a resin inflow portion 62 filled with resin is formed. A metallic plate 63 is provided at the lowermost portion of the resin inflow portion 62 and seals the resin inflow portion 62. A semiconductor chip 2, leads 60 (only one lead 60 is illustrated) and the aforementioned multi-layered wiring member 7 is provided on or over the upper surface of the base 56. The semiconductor chip 2 is hermetically sealed by a frame 58 and a sealing lid 59.

The multi-layered wiring member 7 has a stepwise left portion in which the wiring layers 22, 23 and 46 are stepwise formed. There are provided wires 61, which connect electrode pads (not shown) provided on the semiconductor chip 2 and the wiring layers 22, 23 and 46. With the above structure, the multi-layered wiring member 7 is electrically connected to the semiconductor chip 2. In the right end portion of the multi-layered wiring member 7 in FIG. 15, the wiring layers 22, 23 and 46 are connected to the leads 60 (in FIG. 15, the wiring layer 46 and the lead 60 are connected together by an electrically conductive adhesive). In this manner, the semiconductor chip 2 and the leads 60 are electrically connected together.

It will be noted that the conventional multi-layered wiring member employs via holes or through holes for electrically connecting the stacked wiring layers together, while the multi-layered wiring member 7 provided by the present invention employs the mechanical via hole parts 17 and 18. Hence, the semiconductor device 55 is less expensive.

FIGS. 16 through 20 show a mounting structure in which the semiconductor chip 2 is mounted on the multi-layered wiring member 7.

Figure 16:
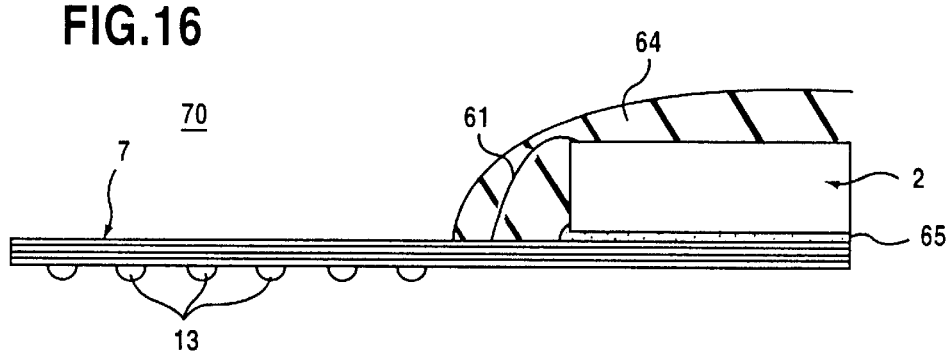
FIG. 16 is a diagram of a first arrangement of a semiconductor chip mounted on a multi-layered wiring member.

A semiconductor device 70 shown in FIG. 16 is designed so that the semiconductor chip 2 is fixed to the multi-layered wiring member 7 by means of a die-bond member layer 65, and the multi-layered wiring member 7 and the semiconductor chip 2 are electrically connected by a wire 61. The semiconductor chip 2 is sealed by potting of a seal resin 64.

Figure 17:
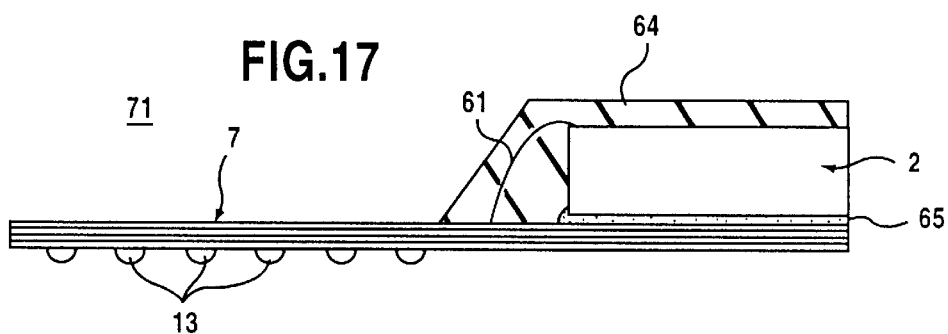
FIG. 17 is a diagram of a second arrangement of a semiconductor chip mounted on a multi-layered wiring member.

A semiconductor device 71 shown in FIG. 17 is designed so that the semiconductor chip 2 is fixed to the multi-layered wiring member 7 by the die-bond member layer 65 in the same manner as the semiconductor device 70 shown in FIG. 16, and the multi-layered wiring member 7 and the semiconductor chip 2 are electrically connected together by means of the wire 61. The semiconductor chip 2 is sealed by molding the sealing resin 64 by means of a mold.

Figure 18:
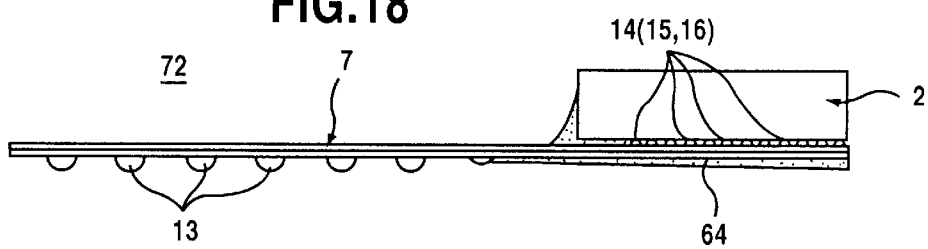
FIG. 18 is a diagram of a third arrangement of a semiconductor chip mounted on a multi-layered wiring member.

A semiconductor device 72 shown in FIG. 18 is designed so that the multi-layered wiring member 7 and the semiconductor chip 2 are electrically connected together by the second mechanical bumps 14 through 16 formed in the multi-layered wiring member 7. The seal resin 64 is provided for protecting the electric connections between the second mechanical bumps 14 through 16 and the semiconductor chip 2.

Figure 19:
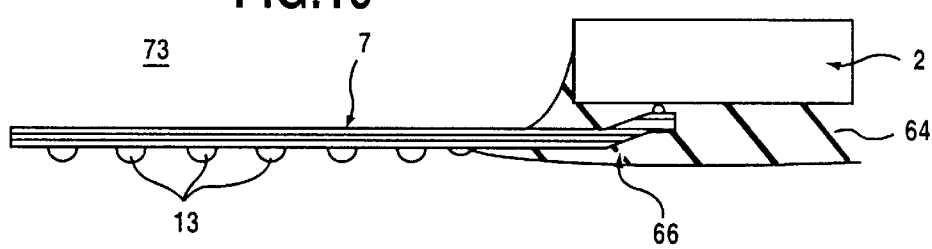
FIG. 19 is a diagram of a fourth arrangement of a semiconductor chip mounted on a multi-layered wiring member.

A semiconductor device 73 shown in FIG. 19 is designed so that a lead finger 66 is formed in the right portion of the multi-layered wiring member 7 and is electrically connected to an electrode bump (not shown) formed on the semiconductor chip 2. That is, the semiconductor device 73 employs the TAB structure. The seal resin 64 is provided for protecting the electric connections between the lead finger 66 and the semiconductor chip 2.

Figure 20:
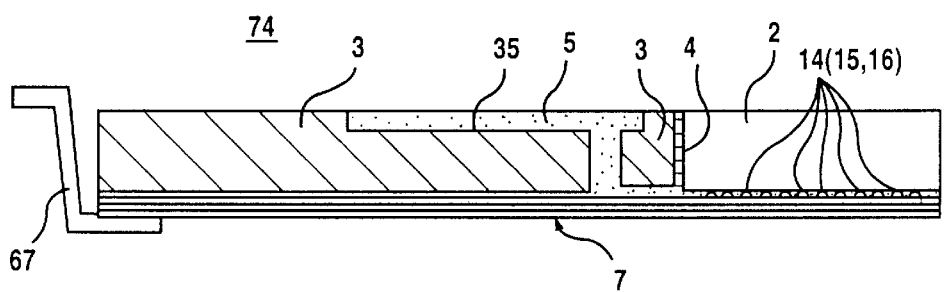
FIG. 20 is a diagram of a fifth arrangement of a semiconductor chip mounted on a multi-layered wiring member.

A semiconductor chip 74 shown in FIG. 20 is designed so that a lead 67 of a gull-wing shape is provided to the multi-layered wiring member 7 instead of the first mechanical bumps. In FIG. 20, parts that are the same as those shown in FIG. 1 are given the same reference numbers, and a description thereof will now be omitted.

As described above, the first mechanical bumps 13, the second mechanical bumps 14 through 16, and the mechanical via parts 17 and 18 can be selectively employed taking into consideration of the structures of the semiconductor devices 1, 55 and 70 through 74, and can be applied to various structures of semiconductor devices.

FIGS. 21A through 21E are diagrams of a step of mounting the semiconductor chip 2 on the multi-layered wiring member 7 and the resin sealing step. The following description of the above steps relates to the semiconductor device 1.

Figure 21A:
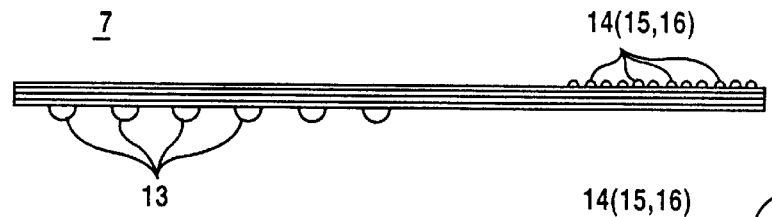
FIGS. 21A–21E are diagrams showing the steps of mounting a semiconductor chip on a multi-layered wiring member and sealing the semiconductor chip with resin.

FIG. 21A shows the multi-layered wiring member 7 in which there are formed the first mechanical bumps 13, the second mechanical bumps 14 through 16 and the mechanical via parts 17 and 18 (these via parts do not appear in FIG. 21A) by the chip mounting and resin sealing steps.

Figure 21B:
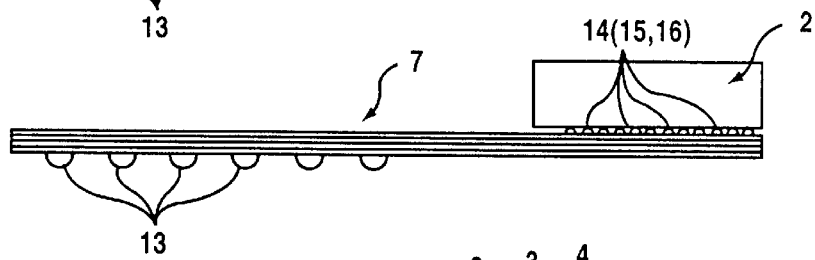
Figure 21C:
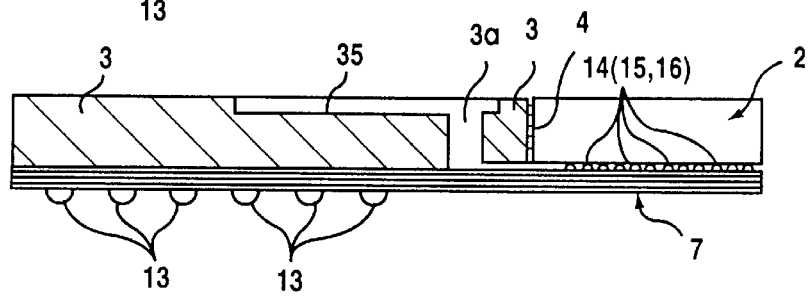

First, the semiconductor chip 2 is mounted on the multi-layered wiring member 7, and the step of connecting the second mechanical bumps 14 through 16 to the electrode pads formed on the semiconductor chip 2 is executed. FIG. 21B shows the multi-layered wiring member 7 on which the semiconductor chip 2 is mounted. After mounting the semiconductor chip 2, as shown in FIG. 21C, the base 3 is provided to the multi-layered wiring member 7. The base has the resin inflow inlet 35. When providing the base 3 to the multi-layered wiring member 7, a side surface of the semiconductor chip 2 is adhered to the base 3 by an adhesive 4.

Figure 21D:
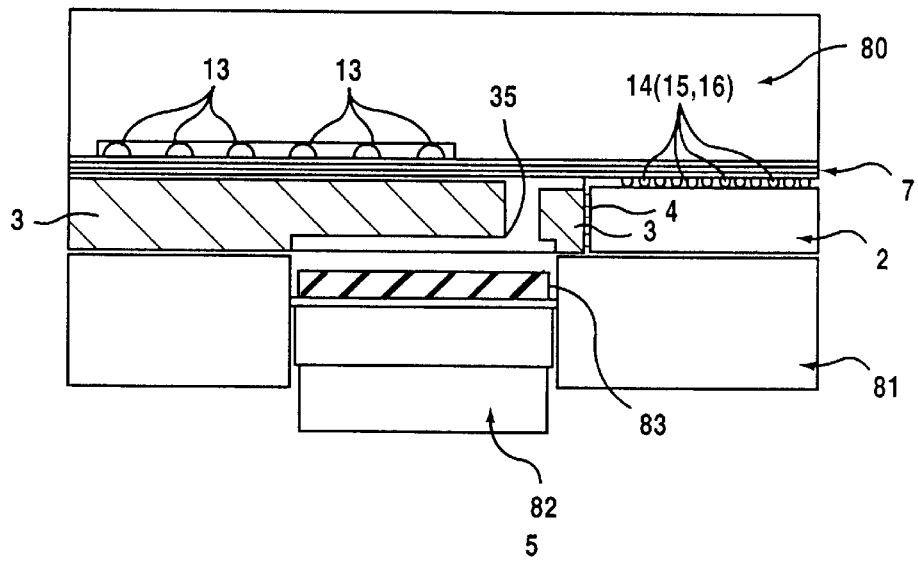
Figure 21E:
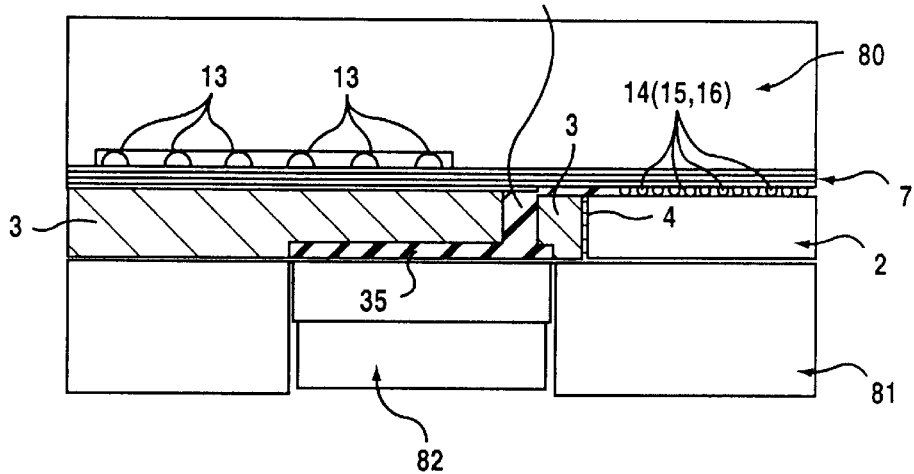

Then, as shown in FIG. 21D, the multi-layered wiring member 7 is placed in a mold having an upper die 80 for resin sealing and a lower die 81 for resin sealing. In FIG. 21D, a resin tablet 83 is provided to the upper portion of a plunger 82. Then, the plunger 82 is ascended while the resin tablet 83 is being heated, so that the melted resin tablet 83 is filled in the resin inflow inlet 35 formed in the base 3 and enters into the gap between the second mechanical bumps 14 through 16 and the semiconductor chip 2. Then, the lid member 6 is provided to the resin inflow inlet 35 in the state in which the resin inflow inlet 35 is completely filled with the sealing resin 5, so that the semiconductor device 1 shown in FIG. 1 is completed.

According to the present invention, it is possible to form electrode parts (bumps for external connections, bumps for connections with a semiconductor chip and via parts connecting wiring layers) by deforming, via a hole formed in an insulating layer, one or a plurality of wiring layers together. The deformation process for forming the electrode parts makes it possible to very easily provide less-expensive electrode parts because one or a plurality of plate-shaped wiring layers are deformed by means of a tool so that a projection is oriented outward or toward a semiconductor chip.

One or a plurality of holes formed in the multi-layered wiring member are formed in only one or a plurality of insulating layers, and are not formed in one or a plurality of wiring layers. Hence, the mechanical strength of the wiring layers can be kept strong and thus the mechanical strength of the overall multi-layered wiring member is very strong. In addition, it is possible to arrange electrode parts at fine pitches and to thus reduce the size of the semiconductor devices.

A plurality of wiring layers of the multi-layered wiring member are electrically connected together by the electrode parts, which realize the same functions as those of the conventional via or through holes. Further, as has been described previously, the electrode parts can be easily provided by the less-expensive deformation process. Hence, it is possible to easily provide the interlayer electric connections between the stacked wiring layers at an less expense. Furthermore, the formation of the electrode parts by the deformation process has a high yield, which leads to a reduction in the production cost.

By using of a solder member provided on the top of a projection obtained by deforming one or a plurality of wiring layers, it becomes possible to reduce the depth of punching (the amount of projection) and to reduce stress applied in the deformed wiring layer or layers. In addition, it becomes possible to improve the junction to a mounting member on which a semiconductor device is mounted.

Use of a reinforcement provided inside a projection obtained by deforming one or a plurality of wiring layers, it becomes possible to improve the mechanical strength of the electrode parts and to prevent spring-back of the electrodes that takes place in the deformation process. Hence, it is possible to stabilize the original shape of the electrode parts.

By providing a metallic layer between wiring layers in a position in which an electrode should be formed, it becomes possible to make sure an electric connection between the wiring layers and to improve the mechanical junction between the wiring layers.

Use of an engagement recess portion formed in an innermost one of wiring layers to be electrically connected together improves the mechanical junction between these wiring layers and makes sure the junction between them.

Further, the method for producing semiconductor devices according to the present invention does not need a complex step. Hence, it is possible to easily produce less-expensive semiconductor devices having excellent electric performance.

One or a plurality of wiring layers can be easily patterned by an etching process, so that a multi-layered wiring member can be easily produced with high productivity.

The electrode parts can be defined by a deformation process using a punch and a mold having a predetermined shape. Hence, it is possible to provide the electrode parts with high reliability by using a simple production facility.

It is also possible to simultaneously form bumps for external connections and bumps for connections with a semiconductor chip and hence produce the electrode parts with high productivity.

A semiconductor chip is mounted and sealed by resin, so that the semiconductor can be stabilized.

The present invention is not limited to the specifically disclosed embodiments, and variations and modifications may be made without departing from the scope of the present invention.

What is claimed is:

1. A semiconductor device comprising:

a semiconductor chip; and a multi-layered member connected to the semiconductor chip, said multi-layered member comprising one or a plurality of wiring layers and one or a plurality of insulating layers alternately stacked, said one or the plurality of insulating layers having holes, said multi-layered member having electrode parts which include deformed portions of said one or the plurality of wiring layers obtained by deforming said one or the plurality of wiring layers via said holes, wherein said deformed portions include projections that serve as bumps oriented opposite to the semiconductor chip and being used for external connections with conductors formed on a member on which the semiconductor device is to be mounted, and wherein said deformed portions include projections oriented toward the semiconductor chip and used for connections with the semiconductor chip.

2. The semiconductor device as claimed in claim 1, wherein said electrode parts include projections of at least one wiring layer of said multi-layered member, said projections being in contact with at least another wiring layer of said multi-layered member, so that at least two wiring layers of said multi-layered member are electrically connected together.

3. The semiconductor device as claimed in any one of claims 1 or 2, further comprising solder members provided on end portions of said bumps.

4. The semiconductor device as claimed in claim 1 or 2, further comprising reinforcement member provided on said bumps.

5. The semiconductor device as claimed in claim 2, further comprising an electrically conductive member interposed therebetween said at least one wiring layer and said at least another wiring layer.

6. A semiconductor device comprising:

a semiconductor chip; and a multi-layered member connected to the semiconductor chip, said multi-layered member comprising one or a plurality of wiring layers and one or a plurality of insulating layers alternately stacked, said one or the plurality of insulating layers having holes, said multi-layered member having electrode parts which include bumps of said one or the plurality of wiring layers obtained by deforming said one or the plurality of wiring layers via said holes, wherein the bumps protrude from a bottom surface of the semiconductor device and form external terminals for external electrical connections of the semiconductor device, said external electrical connections connecting said semiconductor device to external electrical conductors, wherein at least two wiring layers are provided, and wherein the bumps include engagement recess portions which join the at least two wiring layers together.

7. A semiconductor device comprising:

a base;

a semiconductor chip mounted on the base;

a multi-layered member mounted on the base, said multi-layered member comprising wiring layers and insulating layers alternately stacked, the multi-layered member having an end portion in which the wiring layers and the insulating layers are formed in step formation;

bonding wires connecting the semiconductor chip to the multi-layered member, said bonding wires are bonded to step portions of the wiring layers; and leads connected to the multi-layered member and used for external connections;

wherein the multi-layered member has deformed portions of the wiring layers obtained by deforming the wiring layers via holes formed in the insulating layers.

* * * * *